(12) United States Patent
Orlowski et al.

(10) Patent No.: US 6,433,382 B1
(45) Date of Patent: Aug. 13, 2002

(54) SPLIT-GATE VERTICALLY ORIENTED EEPROM DEVICE AND PROCESS

(75) Inventors: Marius Orlowski; Kuo-Tung Chang; Keith E. Witek; Jon Fitch, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/417,537

(22) Filed: Apr. 6, 1995

(51) Int. Cl.$^7$ .............................................. H01L 29/788
(52) U.S. Cl. ...................................... 257/315; 257/329
(58) Field of Search ................................ 257/329, 330, 257/315

(56) References Cited

U.S. PATENT DOCUMENTS

| | | | | |
|---|---|---|---|---|
| 4,554,570 A | * | 11/1985 | Jastrzebski et al. | 257/332 |
| 5,017,977 A | | 5/1991 | Richardson | 357/23.5 |
| 5,208,172 A | | 5/1993 | Fitch et al. | 437/40 |
| 5,280,446 A | | 1/1994 | Ma et al. | 365/185 |
| 5,308,782 A | | 5/1994 | Mazure' et al. | 437/52 |
| 5,324,673 A | * | 6/1994 | Fitch et al. | 257/329 |
| 5,402,371 A | * | 3/1995 | Ono | 257/316 |
| 5,439,838 A | * | 8/1995 | Yang | 257/316 |
| 5,455,792 A | * | 10/1995 | Yi | 257/319 |
| 5,483,094 A | * | 1/1996 | Sharma | 257/329 |
| 5,627,395 A | * | 5/1997 | Witek et al. | 257/350 |
| 5,739,567 A | * | 4/1998 | Wong | 257/316 |

FOREIGN PATENT DOCUMENTS

| JP | 61256673 | * 11/1986 | ................. 257/316 |
|---|---|---|---|

OTHER PUBLICATIONS

Howard B. Pein et al., "Performance of the 3–D Sidewall Flash EPROM Cell", 1993 IEEE/IEDM, Center for Integrated Systems, Stanford Univ., pp. 2.1.1–2.1.4., 12/93.

K.Naruke, et al., "A New Flash–Erase EEPROM Cell with a Sidewall Select–Gate on Its Source Side", Semi. Dev. Engr. Lab., 1989 IEEE/IEDM, pp. 25.7.1–25.7.4., 12/89.

Yoshimitsu Yamauchi et al., "A 5V–Only Virtual Ground Flash Cell with An Auxiliary Gate for High Density & High Speed Appl.", VLSI Res.Lab., 1991 IEEE/IEDM/ pp. 11.7.1–11.7.4., 12/91.

* cited by examiner

Primary Examiner—Mark V. Prenty
(74) Attorney, Agent, or Firm—Keith E. Witek

(57) ABSTRACT

A split-gate EEPROM transistor includes a channel region (22) formed in a vertically disposed semiconductor body (58) and residing intermediate to a drain region (26) and a source region (24). A select gate electrode (28) is horizontally disposed on a semiconductor substrate (20). A floating gate electrode (30) resides adjacent to the channel region (22) and overlies the select gate electrode (28). A control gate electrode (32) resides adjacent to the control gate electrode (30) and also overlies the select gate electrode (28). In operation, the select gate electrode (28) regulates the flow of electrical charge from the source region (24) into the channel region (22), and provides a field plate electrical isolation for adjacent memory cells in an EEPROM array.

38 Claims, 16 Drawing Sheets

SPLIT-GATE VERTICALLY ORIENTED EEPROM DEVICE AND PROCESS

FIELD OF THE INVENTION

This invention relates, in general, to semiconductor devices and to their fabrication, and more particularly, to a vertically oriented EEPROM device, and to a method of fabrication.

BACKGROUND OF THE INVENTION

State of the art electrically-erasable-programmable-read-only-memory (EEPROM) devices having a split-gate configuration offer increased programming efficiency, and can be operated with a single, low-voltage power supply. Typically, an EEPROM device includes a field-effect-transistor (FET) formed in a silicon substrate. The FET includes a floating gate electrode overlying a semiconductor substrate. Electrical charge is transferred to the floating gate electrode through a tunnel dielectric layer, which separates the floating gate electrode from the semiconductor substrate. A control gate electrode is capacitively coupled to the floating gate electrode, such that a voltage applied on the control gate electrode is coupled to the floating gate electrode. Charge transfer to the floating gate electrode is initiated by coupling the voltage from the control gate electrode to the floating gate electrode.

In the split-gate configuration, a select gate electrode also overlies a portion of the channel region of the FET adjacent to the floating gate electrode. The select gate electrode regulates the electrical current flowing in the channel region during programming, at which time the charge is placed on the floating gate electrode. When the select gate electrode is positioned adjacent to the source region in the FET, the EEPROM transistor can be programmed by source-side injection. During programming, an electric field gradient is established in the channel region of the FET, such that electrons originating in the source region are accelerated across a potential drop, and are injected into a floating gate electrode. Programming by source-side injection is carried out at low current levels, which permits EEPROM transistors to be programmed by charge pumping from a single, low-voltage power supply.

While the use of a split-gate configuration and an EEPROM device provides improved device performance, the necessity of placing three gate electrodes in close proximity requires that the EEPROM transistor consume a substantial amount of substrate surface area. More efficient utilization of substrate surface area in advance memory technology is a prominent objective in order to increase the density and the number of memory cells. Conventionally, split-gate EEPROM transistors have been formed in a semiconductor substrate by creating a horizontally disposed channel region intermediate to a source region and a drain region. The floating gate electrode is also horizontally disposed over the channel region. The control gate electrode and the select gate electrode are then positioned about the floating gate electrode. Generally, the floating gate electrode and the control gate electrode are also substantially horizontally disposed on the substrate surface. The necessity of placing the select gate electrode and the floating gate electrode on a horizontally disposed channel region consumes a large amount of substrate surface area.

More recently, split-gate EEPROM transistors have been constructed within trenches formed within a semiconductor substrate. The floating gate electrode, select gate electrode and control gate electrodes are placed within the trench, and the channel region of the FET resides in the substrate along the wall of the trench. Placement of the gate electrodes within the confines of a trench substantially reduces the amount of substrate surface area necessary to form an EEPROM transistor. While placing the gate electrodes of an EEPROM transistor in a trench reduces consumption of substrate surface area, it can be difficult to make electrical contact to the gate electrodes within the trench.

In other applications, more conventional dual-gate EEPROM transistors have been developed that arrange a floating gate and a control gate about a central pillar extending vertically from the semiconductor substrate. Although the pillar arrangement enables control gate electrodes and bit lines to be arranged such that they can be easily contacted in a memory array, the pillar designs cannot obtain the advantages of source-side injection and low-voltage cell operation in the absence of a select gate electrode. Accordingly, further development work is necessary in the design of the EEPROM transistors to provide non-volatile memory devices that can be formed in high density cell arrays, and that can be operated with a single, low-voltage power supply.

SUMMARY OF THE INVENTION

In practicing the present invention there is provided a split-gate vertically oriented EEPROM device, which achieves operational efficiency by arranging a select gate electrode, a floating gate electrode, and a control gate electrode about a central, vertically disposed channel region. In one embodiment of the invention, a semiconductor substrate is provided having a vertically disposed semiconductor body thereon. A doped region in the substrate separates the vertically disposed semiconductor body from the substrate. A horizontally disposed gate electrode overlies the substrate adjacent to the vertically disposed semiconductor body. A first vertically disposed gate electrode overlies the horizontally disposed gate electrode and is positioned adjacent to the vertically disposed semiconductor body. The horizontally disposed gate electrode regulates the flow of electrical charge into the vertically disposed semiconductor body from the semiconductor substrate.

An EEPROM device arranged in accordance with the invention, enables the formation of an EEPROM memory array using field-plate isolation eliminating the need for field isolation regions within the semiconductor substrate. Additionally, an EEPROM. device formed in accordance with the invention, can be operated from a single, low-voltage power supply and programmed by source-side-injection.

Figure 1:
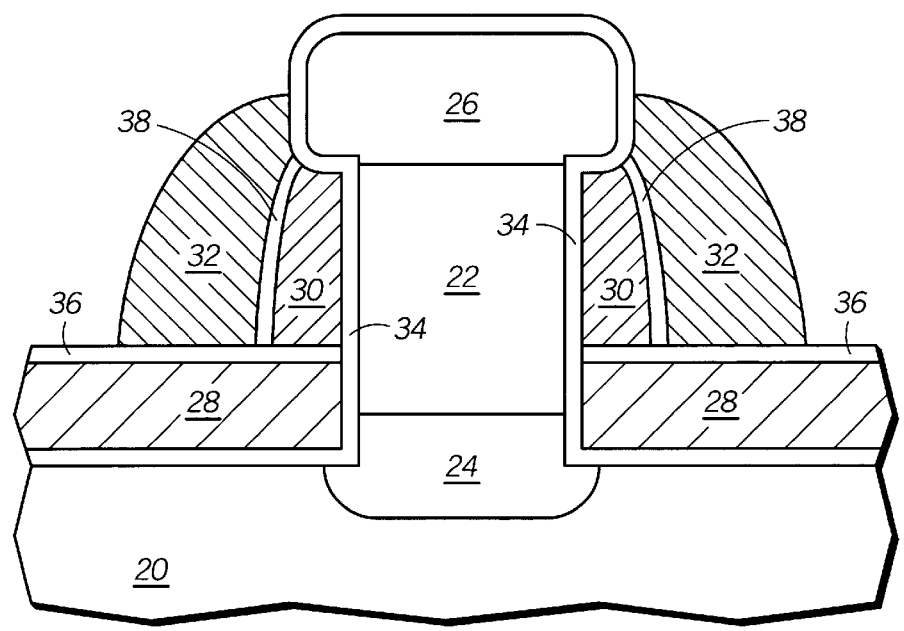
FIG. 1 illustrates, in cross-section, an EEPROM transistor arranged in accordance with one embodiment of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAIL DESCRIPTION OF PREFERRED EMBODIMENTS

The present invention is for a vertical 3-gate EEPROM device. The EEPROM device includes a channel region fabricated by a selective-epitaxial growth (SEG) process. The EEPROM device fabricated in accordance with the invention provides a 3-gate device in which the gate electrodes are symmetrically arranged about a central channel region. The symmetrical arrangement of the gate electrodes about a central channel region enables the EEPROM device to be fabricated in a highly compact cell architecture. Additionally, the symmetrical arrangement of electrodes permits the fabrication of a large number of memory cells over a small substrate surface area.

In one embodiment of the invention, a 3-gate EEPROM device is programmed by source-site injection. A select gate electrode is positioned near the source region of the EEPROM and acts as a current limiter for source-site injection. The use of source-site injection permits programming at a relatively low drain voltage and programming current. Further, the 3-gate EEPROM device using source-site injection can be operated by a single, low-voltage power supply using on-chip charge pumping to attain voltages sufficient to program and erase the device.

FIG. 1 illustrates, in cross-section, one embodiment of a 3-gate EEPROM device constructed in accordance with the invention in a semiconductor substrate 20. A vertically oriented channel region 22 extends upward orthogonally from semiconductor substrate 20. A source region 24 separates channel region 22 from semiconductor substrate 20 and resides in a lower portion of channel region 22. A drain region 26 overlies channel region 22 opposite source region 24. A select gate electrode 28 overlies substrate 20 on either side of channel region 22. A floating gate electrode 30 overlies a portion of select gate electrode 28, extends upward parallel to channel region 22, and surrounds channel region 22. A control gate electrode 32 overlies a second portion of select gate electrode 28 and surrounds both channel region 22 and floating gate electrode 30. A first dielectric layer 34 separates select gate electrode from semiconductor substrate 20 and from channel region 22. A second dielectric layer 36 overlies select electrode 28 and separates select gate electrode 28 from floating gate electrode 30 and control gate electrode 32. A third dielectric layer 38 separates floating gate electrode 30 from control gate electrode 32.

Figure 2:
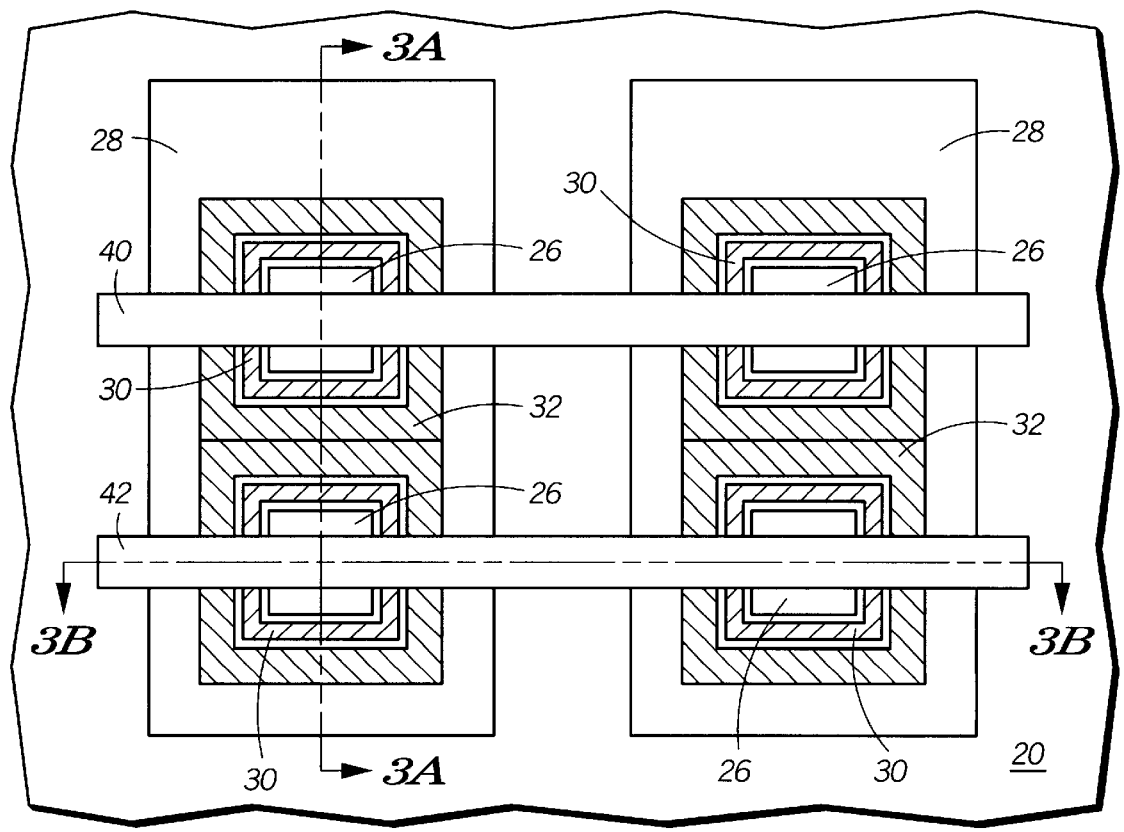
FIG. 2 illustrates a top view of a 4×4section of an EEPROM memory array formed in accordance with the invention.

A top view of a 4×4 section of a memory array incorporating the 3-gate EEPROM embodiment of FIG. 1 is shown in FIG. 2. The memory array includes two pair of adjacent EEPROM transistors arranged in a cross-point array architecture. Select gate electrodes 28 define the lateral extent of each pair of adjacent EEPROM transistors on the surface of semiconductor substrate 20. Parallel bit lines 40 and 42 interconnect drain regions 26 of individual EEPROM transistors in the adjacent cell pairs. Within each cell pair, control gate electrodes 32 form a continuous electrode for both EEPROM transistors. Floating gate electrodes 30 are contained within the perimeter of control gate electrodes 32. As described above, select gate electrodes 28 define electrically isolated regions on semiconductor substrate 20. In the preferred embodiment, a field isolation does not reside intermediate to select gate electrodes 28 or field isolation may not be required due to the fact that the channel region is self-isolated.

Figure 3A:
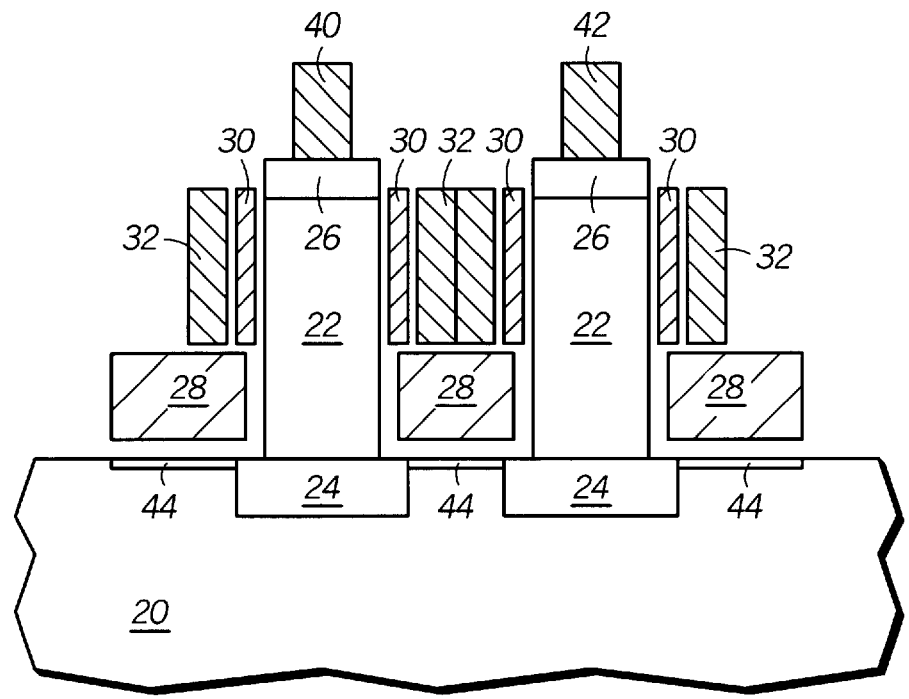
FIG. 3A illustrates, in cross-section, a schematic diagram of the EEPROM memory array of FIG. 2, taken along section line 3A—3A.

FIG. 3A illustrates a cross-sectional view of the 4×4 memory array illustrating an adjacent pair of EEPROM transistors taken along section line 3A—3A. Control gate electrode 32 forms a continuous electrode for controlling the operation of the adjacent EEPROM transistors. Additionally, the single, select gate electrode 28 controls the programming current for both EEPROM transistors. Floating gate electrodes 30 are electrically isolated from all surrounding conductive bodies and operate independently for each EEPROM transistor. A source line 44 interconnects source regions 24 in semiconductor substrate 20. Source line 44 can be formed by diffusing an n-type dopant in the semiconductor substrate 20 to form a current path in a predetermined direction relative to the orientation of the cell pairs in the array. Alternatively, source line 44 can be created by applying a positive voltage to select gate electrode 28 to form an inversion layer in semiconductor substrate 20. The use of an inversion layer to interconnect the source regions of each EEPROM transistor permits the interconnection of source regions to be made intermittently through application of voltage to select gate electrodes 28.

Figure 3B:
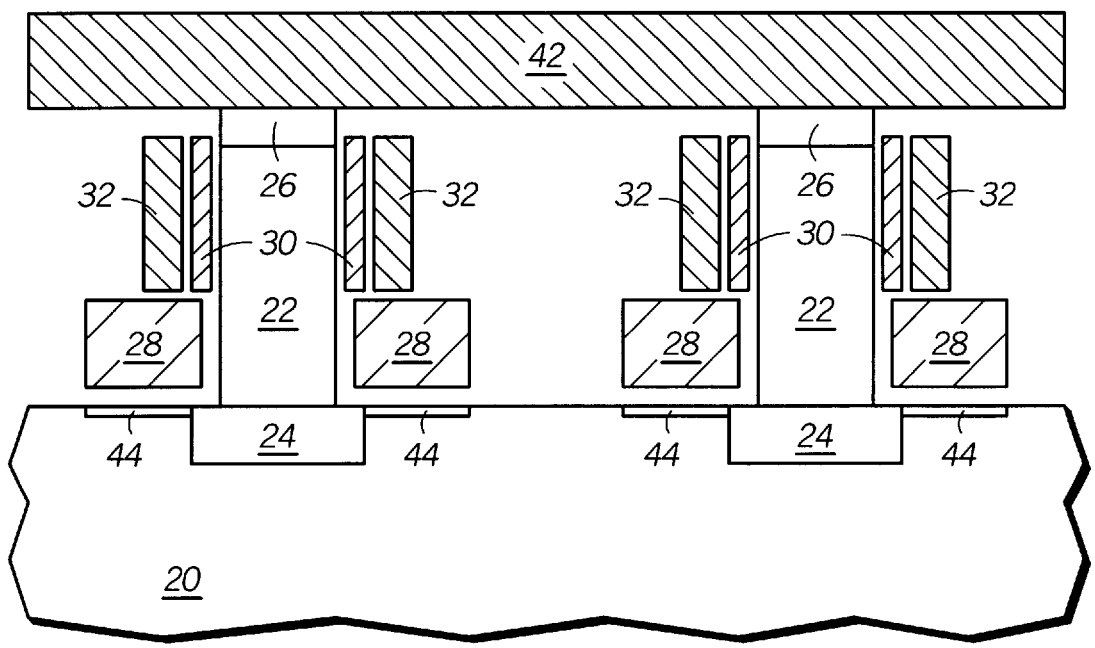
FIG. 3B illustrates, in cross-section, a schematic diagram of the EEPROM memory array of FIG. 2, taken along section line 3B—3B.

A cross-sectional view of the 4×4 memory array taken along section lines 3B—3B, is illustrated in FIG. 3B. Bit line 42 interconnects drain regions 26 of each EEPROM transistor. However, on the same bit line, floating gate electrodes 30 are not connected, and are individual to each EEPROM transistor. Additionally, source lines 44 are also independent for each EEPROM transistor. The formation of select gate electrodes 28 on the surface of semiconductor substrate 20 and separating the floating gate and control gate electrodes from the substrate, enables an EEPROM memory array to be constructed without the need to form field oxide isolation regions. Enhanced operating efficiency is obtained by horizontally disposing select gate electrode 28 on the surface of semiconductor substrate 20. Select gate electrode 28 regulates the programming current from source region 24 to channel region 22, and provides a field plate isolation structure to electrically isolate adjacent memory cells. The field plate isolation provided by select gate electrode 28 advantageously eliminates the need for a field isolation region between memory cells. EEPROM transistors connected to a common bit line can be placed in close proximity, wherein the separation distance is only limited by the overlap of depletion regions in semiconductor substrate 20 created by the operation of the select gate electrodes.

Figure 4:
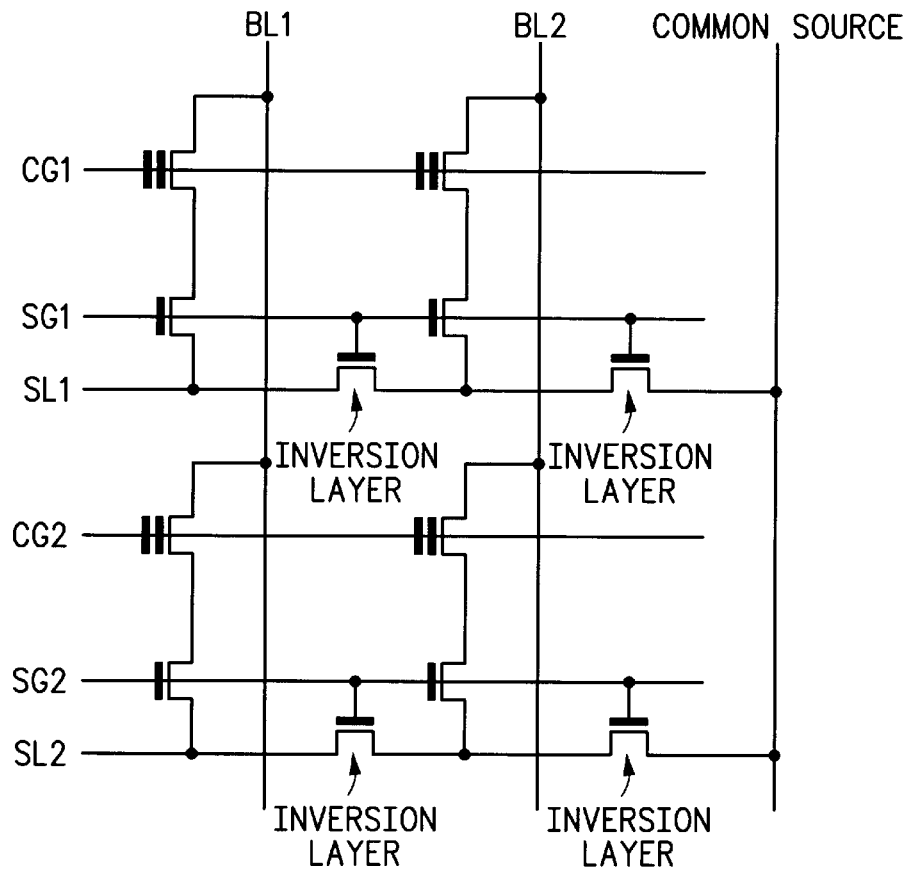
FIG. 4 is a schematic circuit diagram of the memory array shown in FIG. 2.

FIG. 4 illustrates a schematic diagram of a 4×4 portion of an EEPROM memory array incorporating 3-gate EEPROM devices of the invention. Paired bit lines, designated BL1 and BL2, run parallel to one another across semiconductor substrate 20, and are orthogonal to control gate lines, designated CG1 and CG2, and select gate lines, designated SL1 and SG2. Source lines, designated SL1 and SL2, reside in substrate 10 and are disposed parallel to the control lines and the select gate lines. Source lines SL1 and SL2 connect to a common source line running through semiconductor substrate 20 parallel to bit lines BL1 and BL2. In a preferred embodiment, SL1 and SL2 are formed by a diffusion region created in semiconductor substrate 20. The circuit diagram illustrates an alternative embodiment of the invention where an inversion layer resides in semiconductor substrate 20. The inversion layer is formed by applying positive voltages to select gate lines SL1 and SG2. The formation of the inversion layers completes an electrical connection between EEPROM transistors aligned to the source lines SL1 and SL2. Also, the formation of the inversion layer connects these EEPROM transistors to the common source line. The formation of an intermittent source line can further reduce the amount of substrate area needed to form an EEPROM memory array by eliminating the need to account for lateral diffusion in conventionally-fabricated, diffused source lines.

Figure 5:
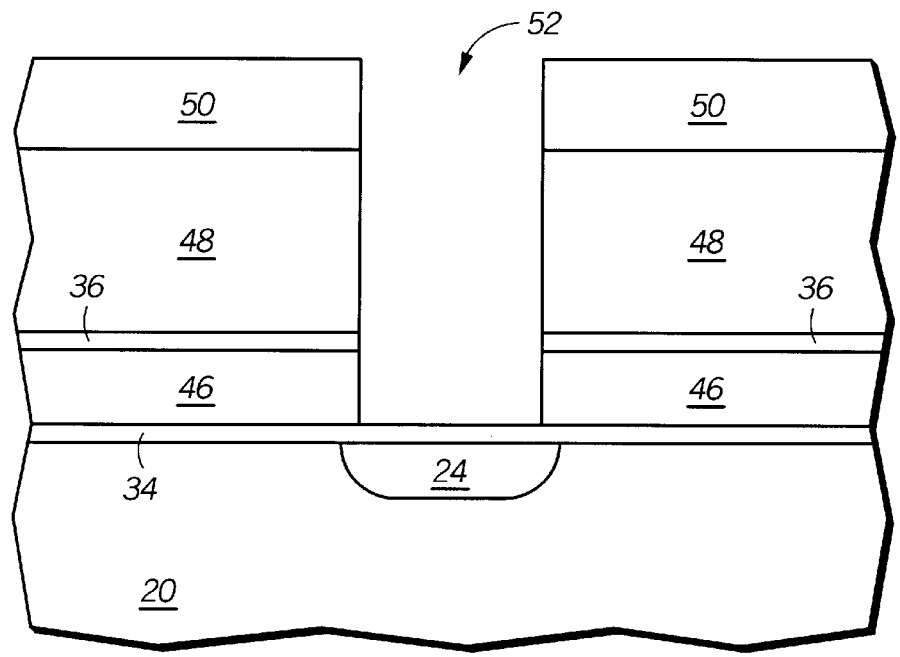
FIGS. 5–11 illustrate, in cross-section, process steps, in accordance with one embodiment of the invention.

FIGS. 5–13 illustrate, in cross-section, process steps for the fabrication of an EEPROM transistor in accordance with the embodiment of the invention illustrated in FIG. 1. Shown in FIG. 5, is a portion of semiconductor substrate having already undergone several process steps in accordance with the invention. A polycrystalline silicon layer 46 overlies the surface of substrate 20. Polycrystalline silicon layer 46 is separated from substrate 20, and from a silicon nitride layer 48, by first and second dielectric layers 34 and 36. A pattern photolithographic layer 50 is formed on silicon nitride layer 48 and silicon nitride layer 48 is etched to form an opening 52 exposing a portion of first dielectric layer 34. Preferably, opening 52 is formed by the sequential anisotropic etching of silicon nitride layer 48, second dielectric layer 36, and polycrystalline silicon layer 46. The chemical components of the anisotropic etching process are adjusted to selectively etch polycrystalline silicon layer 46, while not etching first dielectric layer 34. After forming opening 52, an ion implant process is carried out to form source region 24 in semiconductor substrate 20.

Figure 6:
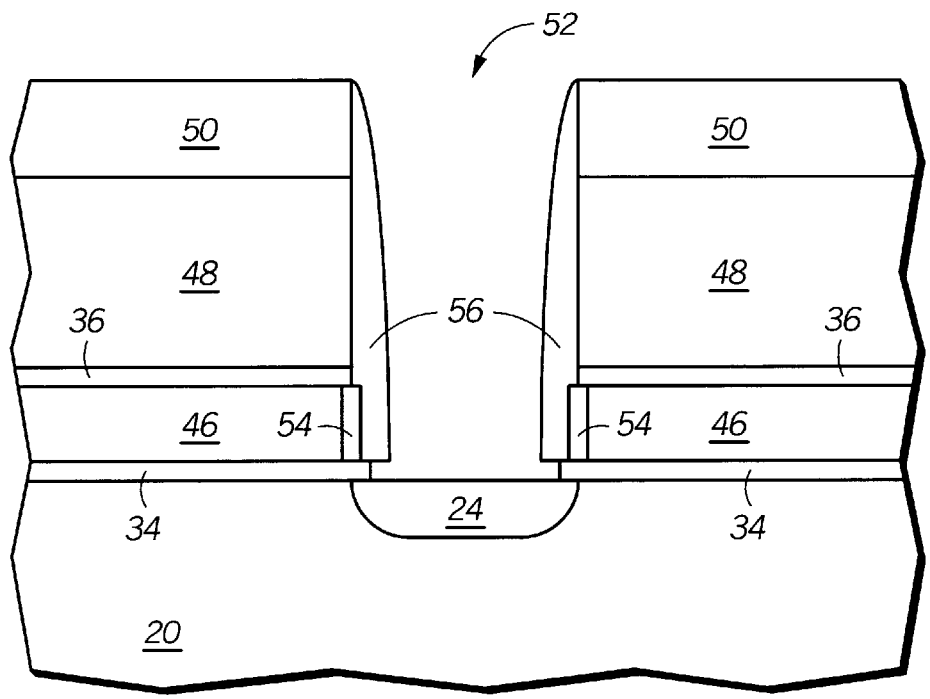
Figure 7:
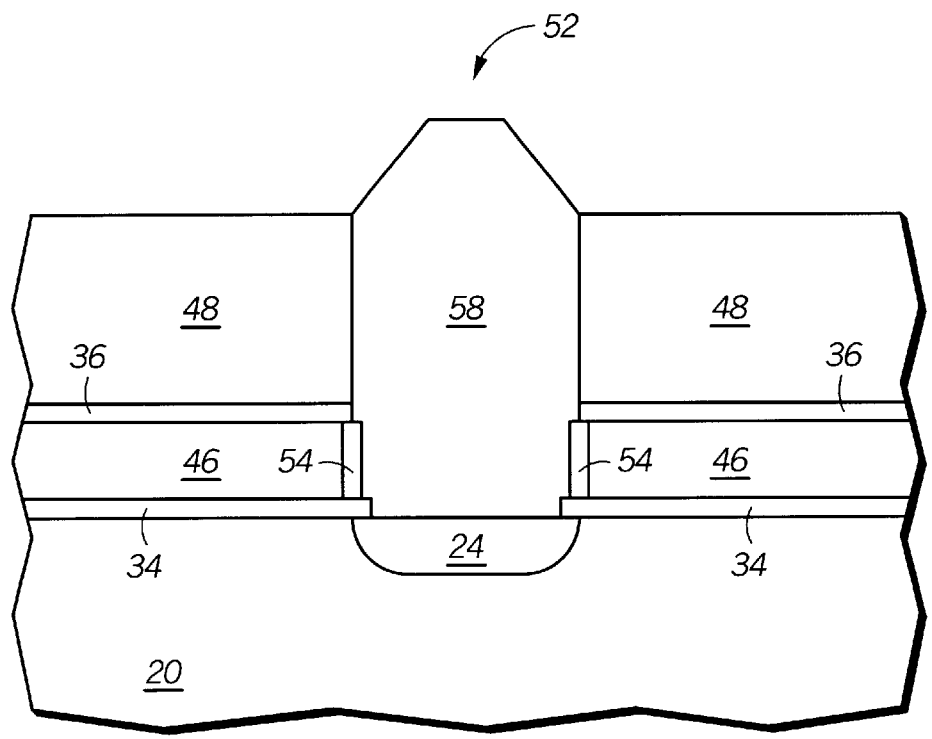

Referring to FIG. 6, after forming, source region 24, patterned photolithographic layer 50 is removed and the exposed portion of polycrystalline silicon layer 46 in opening 52 is oxidized to form an oxide layer 54. Oxide layer 54 will function as the gate dielectric layer for the select gate transistor. Next, a thin layer of polycrystalline is deposited and etched to form a sidewall spacer 56 overlying the inner surface of opening 52. An oxide etching process is then performed to remove first dielectric layer 34 overlying source region 24. Sidewall spacer 56 protects oxide layer 54 from attack from the etchant used to remove the portion of first dielectric layer 34. In an alternative method, oxide layer 54 is grown to a thickness sufficient to withstand attack from an oxide etchant, while still protecting polycrystalline silicon layer 46. If oxide layer 54 is grown to a sufficient thickness, the formation of sidewall spacer 56 is unnecessary thereby simplifying the fabrication process. The final thickness of oxide layer 54 must be within the necessary thickness range to function as a gate dielectric layer After semiconductor substrate 20 is exposed at source region 54, sidewall spacer 56 is removed and a selective epitaxial growth (SEG) process is carried out to form a vertically disposed semiconductor body 58 in opening 52, as illustrated in FIG. 7. In the selected epitaxial growth process, the conditions are adjusted so that epitaxial silicon is formed only on exposed silicon surfaces wherein the epitaxial silicon is monocrystalline silicon. The exposed silicon surface acts as a nucleation site for the epitaxial growth process. Once the selective growth process begins on a nucleation site, the initially formed layer of silicon itself acts as a nucleation site so that the reaction continues forming successive layers of silicon eventually forming a thick layer. The selectively grown silicon does not otherwise deposit on oxides or other dielectric materials.

Figure 13:
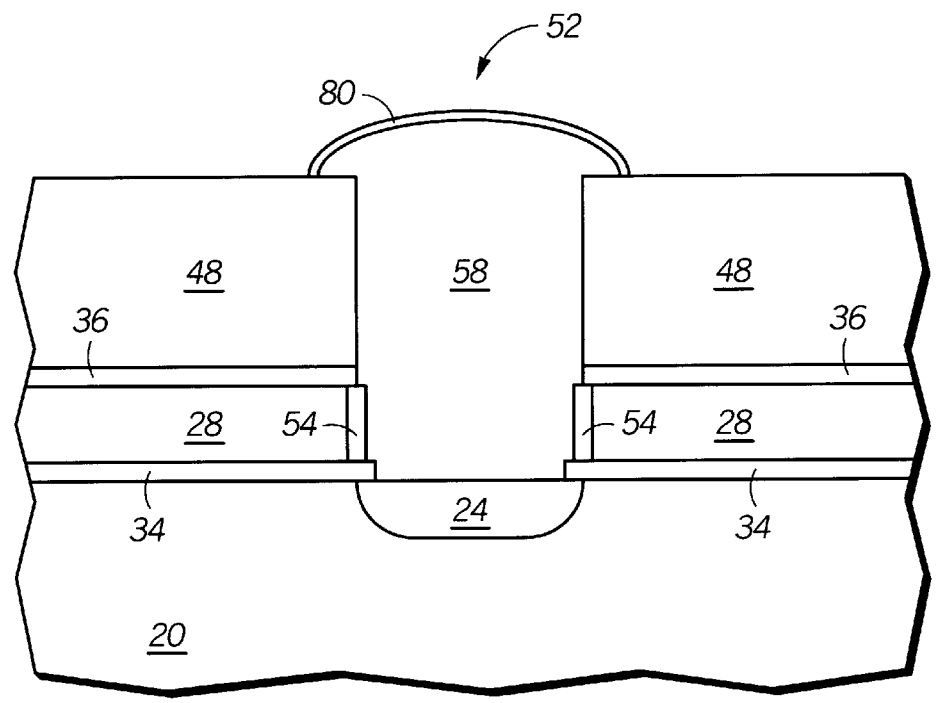
FIG. 13 illustrates, in cross-section, a process step in accordance with another embodiment of the invention.

The SEG process substantially fills opening 52 with a body of semiconductor material. The epitaxial growth process can be controlled such that the extent of the epitaxially grown silicon is confined to the immediate vicinity of opening 52. Alternatively, the epitaxial growth process can be extended such that semiconductor body 58 protrudes beyond the confines of opening 52 and overlies a portion of the surface of silicon nitride layer 48. Where the epitaxial growth process is extended, semiconductor body 58 appears as illustrated in FIG. 13. As will be subsequently described, the overlap of semiconductor body 58 onto silicon nitride layer 48 can be advantageously used to simplify the fabrication of a vertical 3-gate EEPROM transistor.

Figure 8:
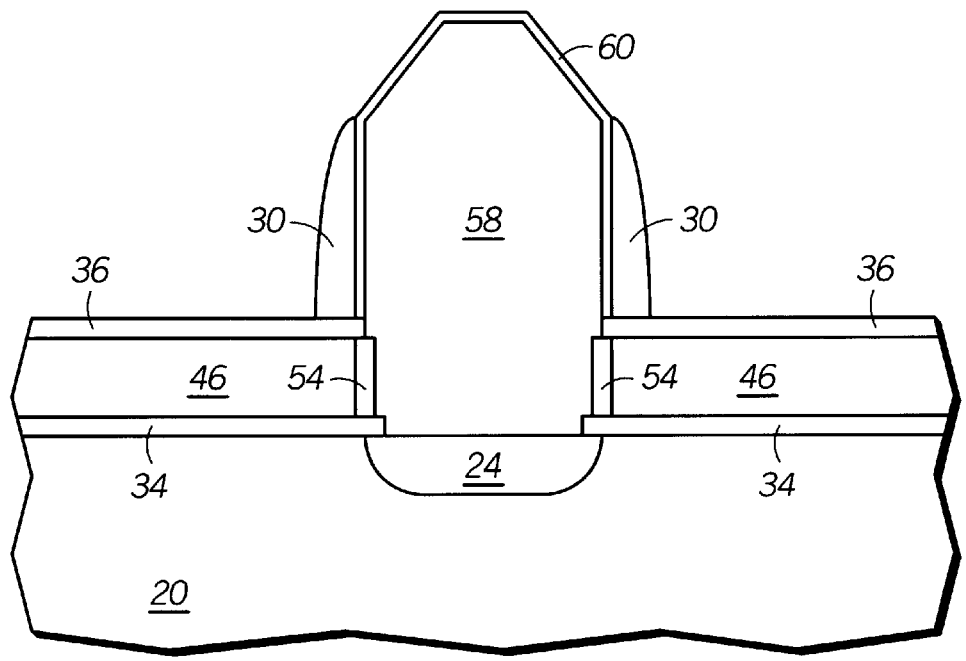

Pursuant to the present embodiment, following the epitaxial growth process, silicon nitride layer 48 is removed and a thin tunnel oxide layer 60 is grown on semiconductor body 58, as illustrated in FIG. 8. Preferably, silicon nitride layer 48 is removed in a hot phosphoric acid bath, which selectively removes silicon nitride in the presence of silicon dioxide. During the oxidation process used to form tunnel oxide layer 60, additional silicon dioxide could possible form in oxide layer 54, and in second dielectric layer 36. The additionally formed silicon dioxide improves the ability of oxide layer 54 to function as a gate dielectric material.

Following the formation of tunnel oxide layer 60, a floating gate electrode 30 is formed as a sidewall spacer on semiconductor body 58. Preferably, floating gate electrode 30 is formed by the chemical vapor deposition of a layer of polycrystalline silicon to overly semiconductor body 58. Then, a reactive ion etching process is carried out to anisotropically etch the polycrystalline silicon and form a sidewall spacer on semiconductor body 58.

Figure 9:
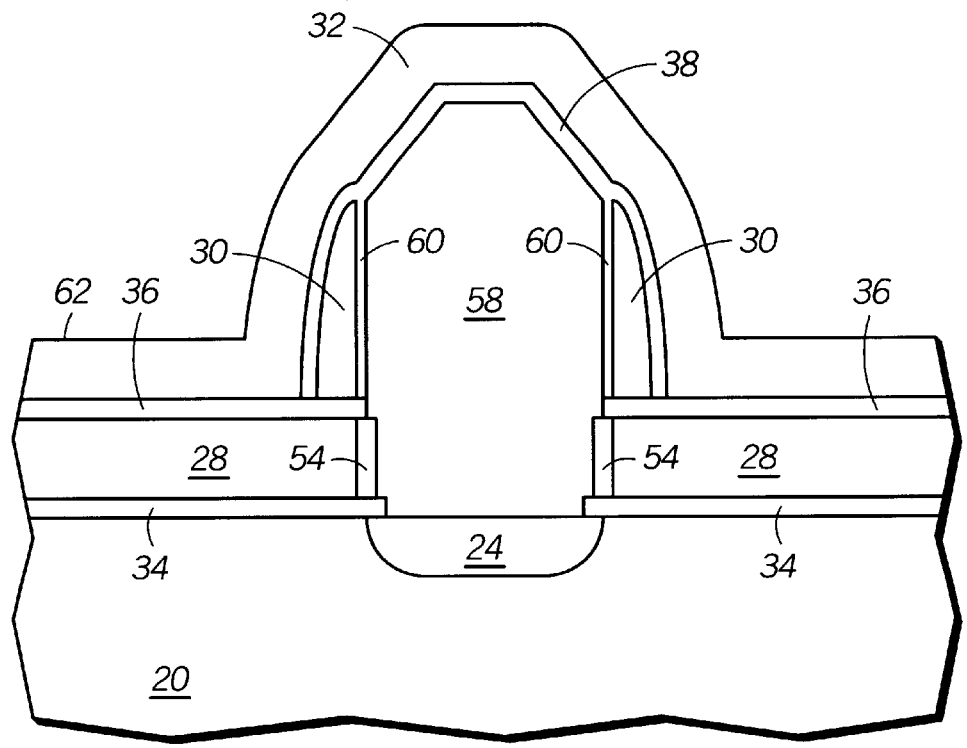

Referring to FIG. 9, after forming floating gate electrode 30, third dielectric layer 38 and control gate electrode 32 are formed. Third dielectric layer 38 can be formed by oxidizing floating gate electrode 30 and semiconductor body 58. Alternatively, third dielectric layer 38 can be an oxide-nitride-oxide (ONO) layer formed by the oxidation of silicon and the chemical vapor deposition of silicon nitride and silicon dioxide. After forming third dielectric layer 38, a layer of polycrystalline silicon is deposited to overlie select gate 28, floating gate electrode 30, and semiconductor body 58.

At this point in the fabrication process various pattern definition processing steps can be carried out to form a variety of electrode configurations in the present EEPROM transistor embodiment. For example, polycrystalline silicon layer 62 can be anisotropically etched to form a control gate electrode having a sidewall spacer configuration, as illustrated in FIG. 1. Alternatively, a photolithographic patterning and reactive ion etching process can be carried out to form a control gate electrode as schematically illustrated in FIGS. 2 and 3. Furthermore, polycrystalline silicon layer 46 can be etched at the same time as polycrystalline silicon layer 62 to define the configuration of select gate electrode 28. Select gate electrode 28 can be aligned to control gate electrode 32, or select gate electrode 28 can be separately patterned to have a configuration different from control gate electrode 32, as illustrated in FIGS. 1–3. The particular configuration of control gate electrode 32 and select gate electrode 28 will depend upon the requirements for the formation of an EEPROM memory array.

Figure 10:
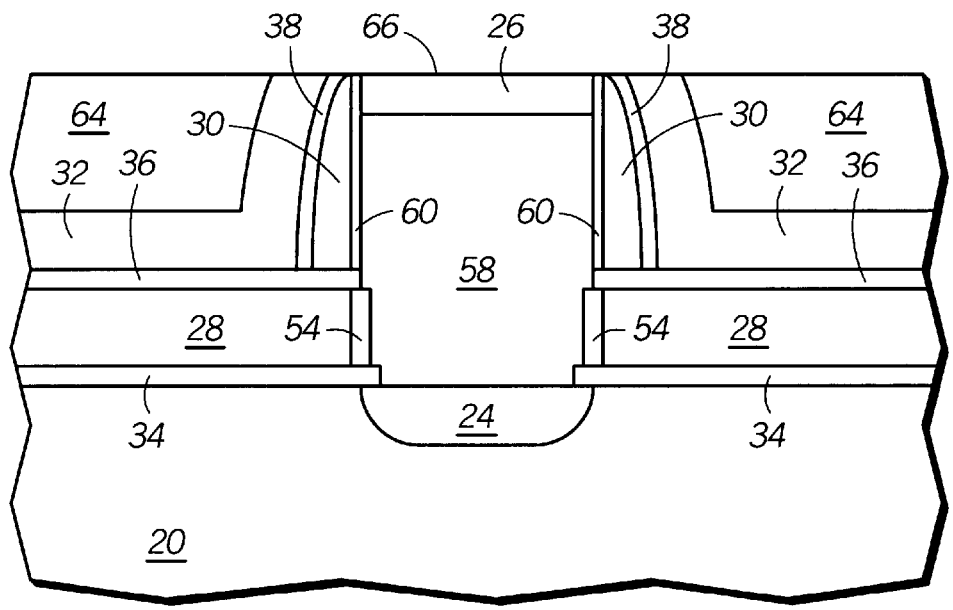
Figure 11:
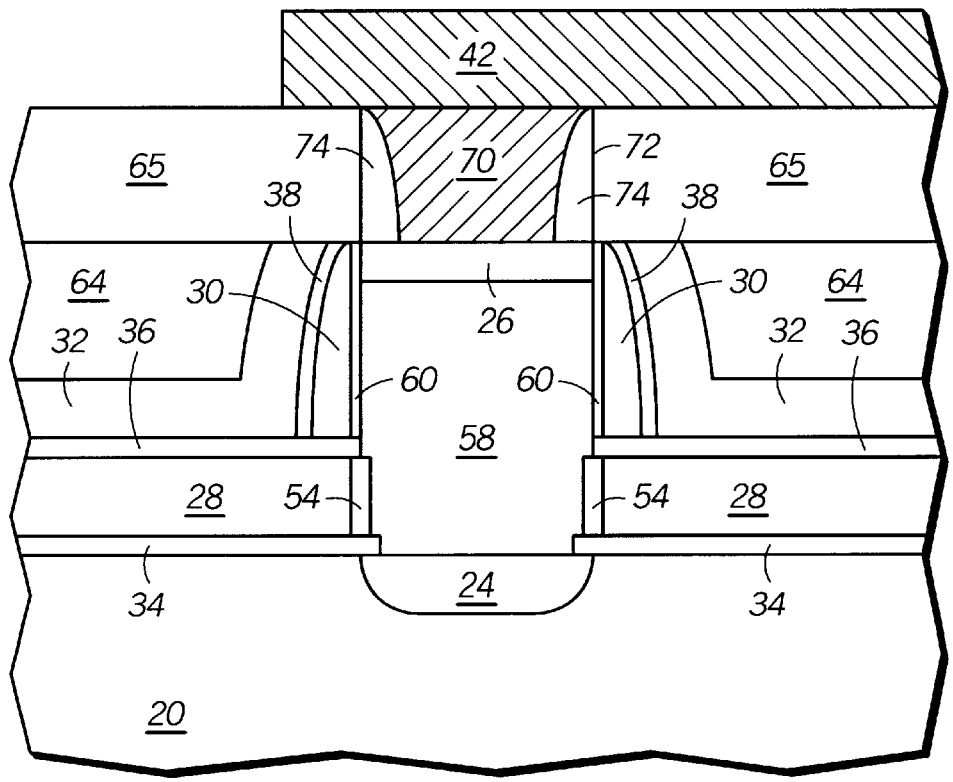

The inventive process continues with the formation of a bit line and a bit line contact as illustrated in FIGS. 10 and 11. Referring to FIG. 10, a thick inter-level-dielectric (ILD) layer 64 is deposited to overly control gate electrode 32 and a planarization process is performed to expose a surface portion 66 of semiconductor body 58. ILD layer 64 can be silicon dioxide deposited from a tetraethoxyorthosilane (TEOS) source gas. Alternatively, ILD layer 64 can be silicon glasses doped with either boron or phosphorous, or both. Preferably, a chemical-mechanical-polishing (CMP) process is used to planarize ILD layer 64 and expose surface portion 66. The CMP process employs a non-selective slurry to remove both dielectric material and polycrystalline silicon at substantially the same rate. The non-selective slurry forms a smooth and continuous surface across the dielectric material, single crystalline, and the polycrystalline silicon material. Alternatively, a planarizing etch back process can be used. The etch back process requires the deposition of a thick layer of photoresist followed by a non-selective etching process to remove the photoresist and polycrystalline silicon/silicon/oxide at the same rate.

After exposing surface portion 66 of semiconductor body 58, an ion implantation process is carried out to form a drain region 26 at exposed surface 66. Preferably, a thin silicon dioxide layer is formed over exposed surface 66 prior to performing the ion implant process. Then, a bit line 42 and bit line contact 70 are formed, as illustrated in FIG. 11. A second ILD layer 65 is formed to overlie first ILD layer 64 and expose surface 66. Next, second ILD layer 65 is photolithographically patterned and etched to form an opening 72 therein. After forming opening 52, an electrically conductive sidewall spacer 74 is formed in opening 72, and a metallized bit line contact 70 is formed within opening 72. In the alternative, spacer 74 may be dielectric material to allow for lithographic misalignment of the opening 72 without electrically short circuiting floating gate 30 to contact 70. An electrically conductive sidewall spacer 74 can be formed by the deposition and ion etching of a thin layer of a metal, such as a refractory metal, and aluminum, and alloys thereof, and the like. Preferably, a tungsten plug process is used to form bit line contact 70. A tungsten plug is formed by depositing a layer of tungsten to overly second ILD layer 65, then forming a planar surface using either a CMP process, or an etch back process, and the like. Once a planar surface has been formed, a metal layer is deposited, photolithographically patterned, and etched to form bit line 42.

Those skilled in the art will recognize that other methods can be used to form a bit line contact to drain region 26. For example, the metal layer forming bit line 42 can be deposited directly into via opening 72. Further, electrically conductive sidewall spacer 74 are optional and are not necessary for the fabrication of a bit line contact in situations where exact alignment of the bit line to via opening 72 is not necessary.

Figure 12:
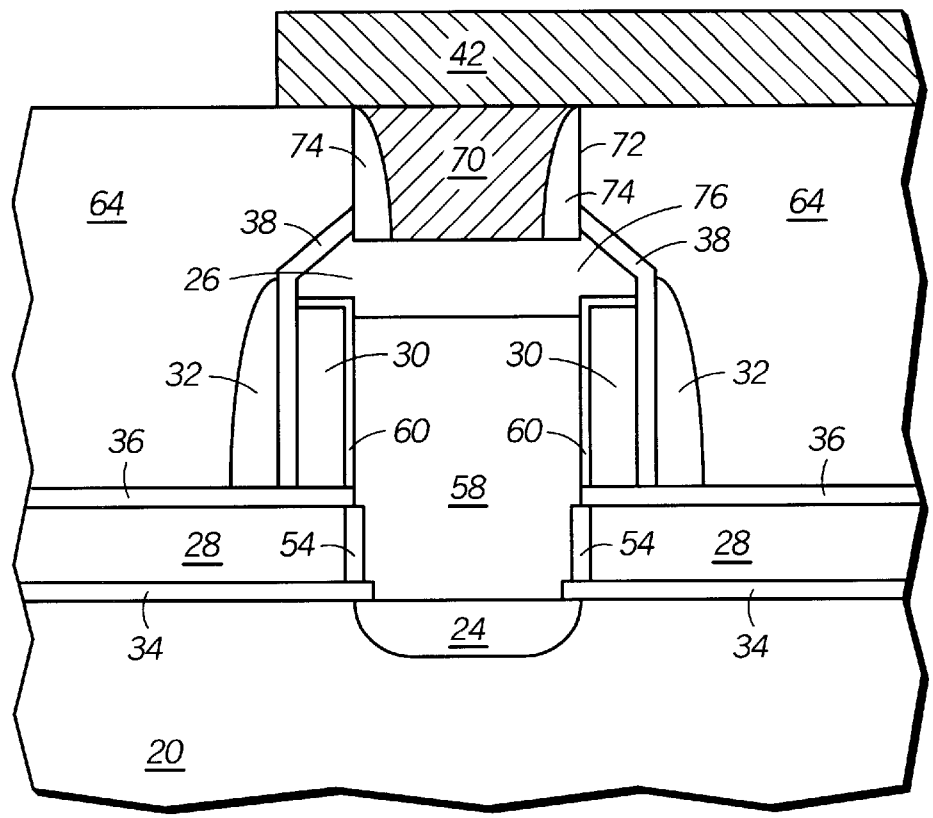
FIG. 12 illustrates, in cross-section, an EEPROM transistor arranged in accordance with another embodiment of the invention.

An EEPROM transistor having a drain region arranged in accordance with an alternative embodiment is illustrated in FIG. 12. An overlapping drain region 76 and floating gate electrode 30 are formed by an alternative processing embodiment illustrated in FIG. 13. After forming opening 52, the selective epitaxial growth process is extended, such that a portion of semiconductor body 58 overlies a surface portion of silicon nitride layer 48. The layer 48 is remvoed to expose a sidewall of layer 58. Tunnel oxide layer 60 is formed after removal of layer 48, and a polycrystalline silicon layer is deposited and anisotropically etched to form floating gate electrode 30.

Referring to FIG. 12, third dielectric layer 38 and drain region 26 are formed in accordance with the previously described processing technique. Control gate electrode 32 is formed by the deposition and anisotropic etching of a polycrystalline silicon layer to form a sidewall spacer adjacent to floating gate electrode 30. Bit line 42 and bit line contact 70 are formed in accordance with the previously described processing technique.

FIG. 13 illustrates a method wherein lateral overgorwth is performed to form a portion of layer 58 over the dielectric layer 48. This overgrowth region can be used to form a self-aligned floating gate underneath the overgrowth. A layer 80 is an optional dielectric layer which can be formed overlying the top of the region 58. This overgrowth method is used to self-align the floating gate 30 in FIG. 12 which uses single crystalline selective growth.

Figure 14:
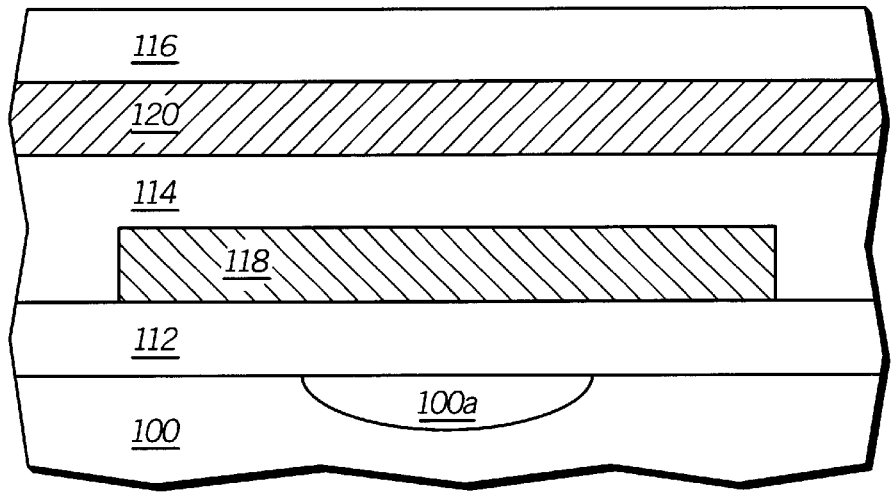
FIGS. 14–24 illustrate, in a cross-sectional flow, a process for forming an EEPROM in accordance with the present invention.

FIGS. 14 through 24 illustrate a method for forming an alternative embodiment similar to the EEPROM of FIGS. 1–13. FIG. 14 illustrates a semiconductor substrate 100. A doped region or diffusion region 100a is formed within the substrate 100. The doped region 100a is of a conductivity type opposite to that of the substrate 100 and may be either N-type or P-type. Region 100a is formed by masking the substrate using conventional lithographic and photoresist processing and subsequently performing a step of dopant diffusion or ion implantation. The ion implantation may be performed using one or more of arsenic, antimony, boron, phosphorous or like dopant atoms. The region 100a will provide one electrode of a transistor within the EEPROM cell and source electrode interconnection in the EEPROM cell layout. After forming the diffusion layer 100a, a dielectric layer 112 is deposited or grown over the substrate 100. Dielectric layer 112 can be a TEOS layer, a shielded BPSG layer, a shielded PSG layer, a sheilded BSG layer, a thermal silicon dioxide layer, a nitride rich oxide layer, silicon nitride composites, a composite oxide layer, or any like insulator. The layer 112, as well as other dielectric layers taught herein, is preferably a thermal or TEOS-based oxides which may be formed by thermally growing silicon dioxide by exposing a substrate to oxygen at a high temperature or may be formed by chemical vapor deposition processes which includes APCVD or PECVD. A typical low temperature $SiO_2$ deposition process involves exposing a substrate to $SiH_4+O_2$ to deposit $SiO_2$ on the substrate with hydrogen as a byproduct . Typical temperatures for dielectric deposition range from between 200° C. and 900° C.

Once dielectric layer 112 is formed, a polysilicon or like conductive layer 118 is formed overlying the dielectric layer 112. Conductive layer 118 is preferably polysilicon or amorphous silicon, but may comprise one or more of a silicided layer, a salicided layer, a metallic layer, or a like conductor.

Polysilicon is typically deposited by exposing the surface of layer 112 to silane ($SiH_4$) in a temperature range of roughly 550° C. to 670° C. Conventional photoresist processing is used to spin a photoresist material over layer 114. This photoresist layer is pre-baked, post-baked, exposed to light via lithographic techniques, and chemically developed in a manner widely known in the art. After this photolithographic processing, layer 118 is etched into a predetermined pattern. Once layer 118 has been patterned, a dielectric layer 114 is deposited over layer 118. Layer 114 is formed in a manner similar to layer 112. After formation of the layer 114, a second semiconductive or conductive layer 120 is deposited over layer 114. Preferably layer 120, similar to layer 118, is polysilicon or amorphous silicon. Layer 120, in a manner similar to layer 118, is patterned using conventional integrated circuit processing. Once layer 120 has been patterned, a dielectric layer 116 is formed overlying the layer 120 to isolate a top portion of the layer 120.

Figure 15:
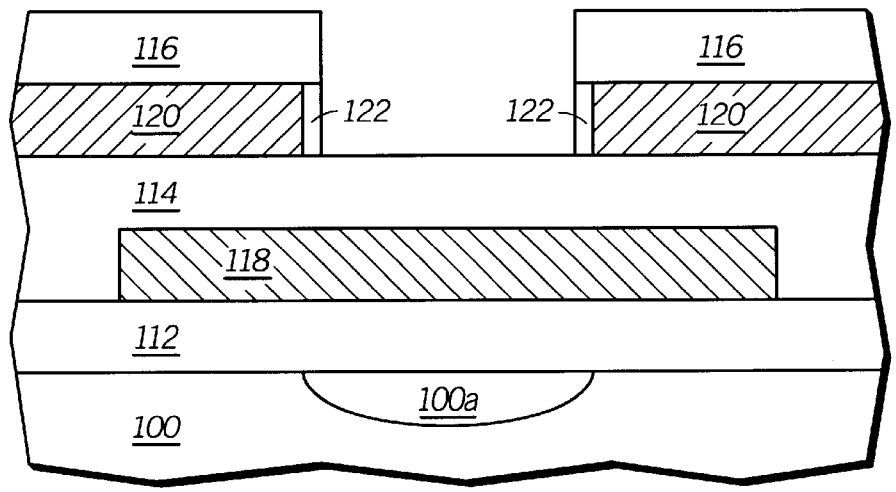

FIG. 15 illustrates that an opening is formed in layer 116. The layer 116 is masked by a photoresist material which is formed with an opening that exposes a top portion of the layer 116. The photoresist and the exposed portion of layer 116 are then exposed to a fluorine-deficient plasma such as a plasma containing $CF_4$ and/or $CHF_3$ which removes the exposed portion of the layer 116 selective to the underlying layer 120. This etch step is typically performed in a dry etch manner or a reactive ion etch (RIE) process. After the opening is etched in layer 116, the opening is extended through layer 120 using a polysilicon etch process which is selective to silicon dioxide. A process which can be used to etch polysilicon or amorphous silicon selective to oxide involves exposing the layer 120 to a plasma containing $SF_6$ and $Cl_2$ or a like polysilicon etching material. This etch process, since it is selective to oxide, will stop on the layer 114 as illustrated in FIG. 15. Once the opening has been formed through layers 116 and 120, a thermal oxide or sidewall spacer layer referred to as layer 122 is formed in FIG. 15 laterally adjacent the opening formed through layer 120. Composite gate dielectrics are advantageous when forming transistors and therefore layer 122 may be a combination of a deposited sidewall spacer and a grown thermal oxide to reduce breakdown and improve the stability of the gate oxide 122 over EEPROM life-time.

Figure 16:
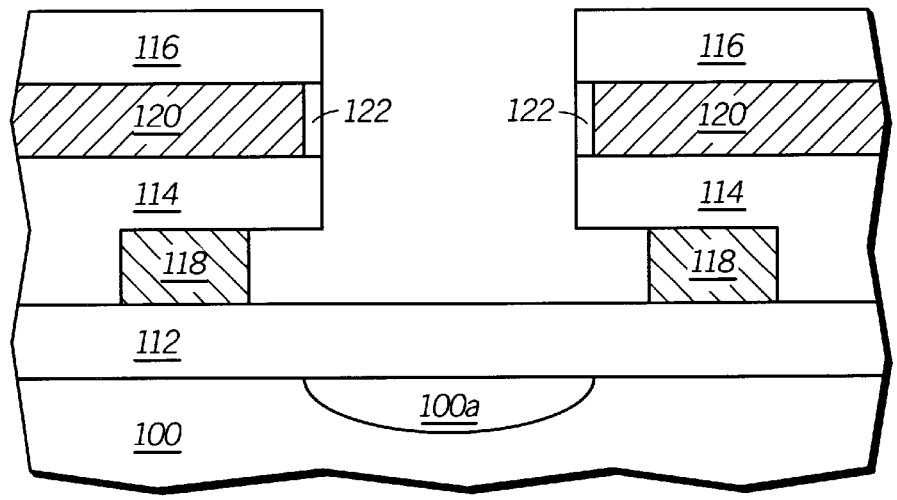

FIG. 16 illustrates that, subsequent to the formation of layer 122, an etch process is further employed to deepen the opening through layer 114. The etch process used to etch the opening through 114 is analogous or similar to the process used to form the opening in layer 116. The opening through layer 114 exposes a top portion of the layer 118. The layer 118 is then etched using either an isotropic or wet etch process or a combination of a reactive ion etch process and isotropic/wet etch process. Reactive ion etch processing of silicon and polysilicon is taught above and isotropic etch processing may be performed by exposing layer 118 to a wet mixture of nitric acid and hydrofluoric acid. The exposure of layer 118 to an isotropic, dry isotropic, or wet etch results in layer 118 being selectively recessed underneath layer 114 as illustrated in FIG. 16.

Figure 17:
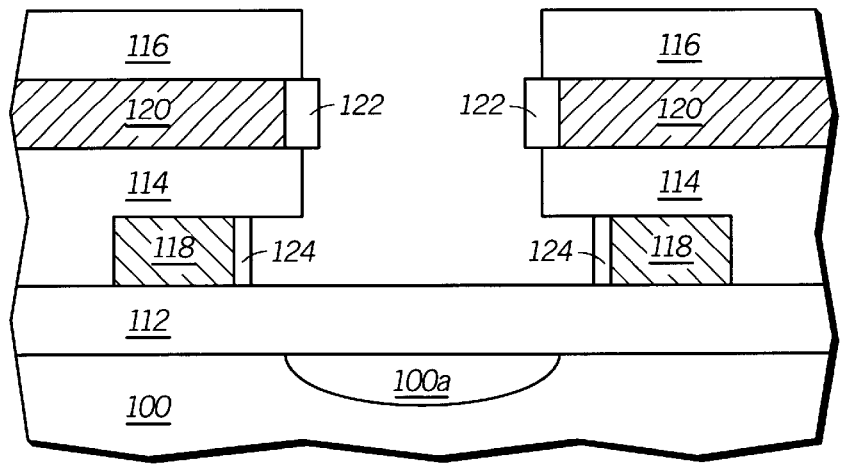

FIG. 17 illustrates that a thermal oxide layer 124 is formed laterally adjacent the polysilicon layer 118. The growth of layer 124 will probably result in a thickening of the layer 122. This thickening can be remedied by exposing layer 122 to a subsequent brief etch process. In another form, the amount of thickening of gate oxide 122 may be taken into account to form a thinner layer 122 initially in FIG. 15. With this thinner layer 122 in FIG. 15, thickening which occurs when the layer 124 is formed will benefit oxide 122 rather than being detrimental. To avoid thickness variations in the layers 122 and 124, these layers can be isotropically etched away and grown anew to create new layers 124 and 122 that are of roughly equal thickness (i.e., a sacraficial gate oxide process).

Figure 18:
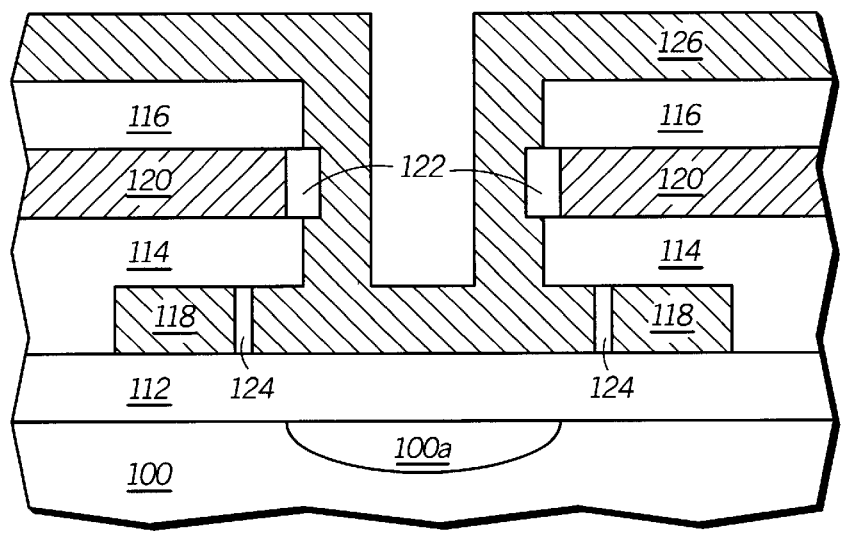

FIG. 18 illustrates that polysilicon or amorphous silicon layer 126 is deposited after the step of forming the oxide 124. Polysilicon deposition is highly conformal and will fill the recessed area formed by the previous step of isotropic etching of layer 118.

Figure 19:
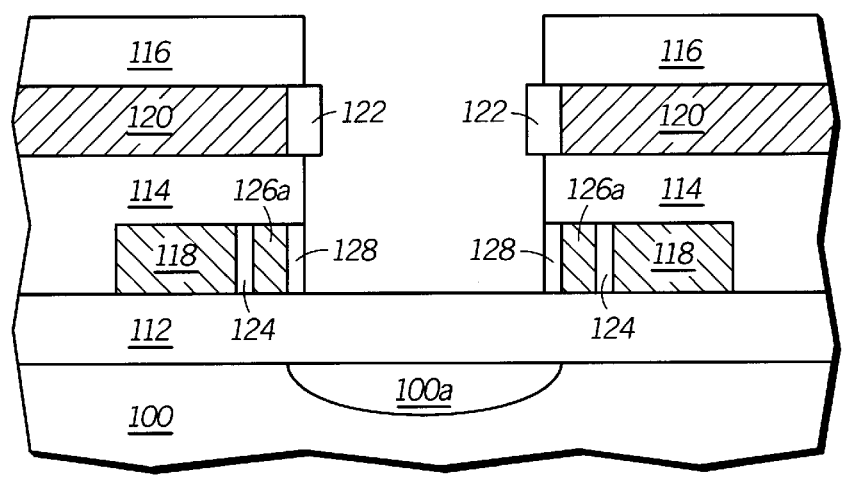

FIG. 19 illustrates that layer 126 is exposed to an RIE etch process and/or an isotropic etch process to form a cylindrical ring of polysilicon material referred to as layer 126a in FIG. 19. Layer 126a is a floating ring of polysilicon which is not coupled to any other conductive layer. In other words, layer 126a forms a floating gate for the EEPROM device. After formation of the ring 126a. a dielectric layer 128 is formed laterally adjacent the ring 126a. The formation of dielectric layers such as dielectric layer 128 has been taught above (see above discussion of layer 122).

Figure 20:
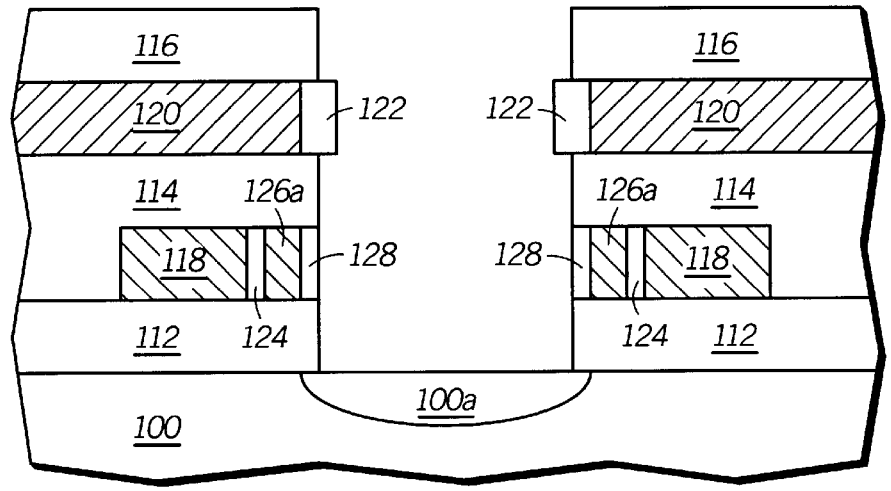

FIG. 20 illustrates that the opening is further extended through layer 112 using etch processing taught herein. The opening through layer 112 exposes a top surface of the diffusion 100a. In one form, care should be taken to insure that lithographic misalignment does not result in the substrate 100 (an area not doped as diffusion 100a) being exposed by the opening. In other words, it is important that the opening expose only a top surface of diffusion 100a and not a portion of substrate 100 which is not within diffusion 100a. In another form, an ion implantation step self-aligned to the opening may be performed in FIG. 20 to further dope and define a geometric shape of a portion of the diffusion 100a which is within or directly surrounding the opening. In any event, misalignment may affect device operation slightly but will not render the device inoperable.

Figure 21:
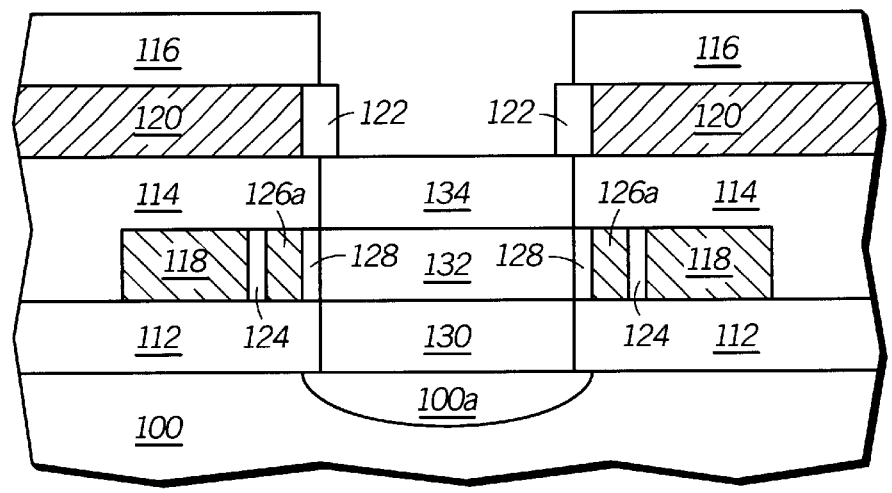

FIG. 21 illustrates that epitaxial layers 130, 132, and 134 are formed. Epitaxial growth is a process by which the material of substrate 100 or diffusion 100a is extended vertically through the opening formed in FIGS. 14 through 20. Epitaxial growth occurs by exposing the diffusion 100a to silicon tetrachloride, trichlorosilane, dichlorosilane, silane, or a like Si or semiconductor growth species. In some cases, an etchant such as HCl may be used in the epitaxial ambient to provide for a more controlled growth rate and avoid growth on oxides or layers other than an epitaxial seed layer. Facetless epi-processes may also be used as taught in the art to insure that the layers 130, 132, and 134 are uniform in thickness throughout their surface area. Epitaxial growth processes typically require a temperature in the vicinity of 850° C. to 950° C.although processes vary between 200° C.and 1100° C. In addition to exposing the substrate diffusion 100a to a growth species, dopant atom such as boron, arsenic, antimony, germanium, or phosphorous may be provided to the substrate during growth of epitaxial material to avoid the need for an ion implantation step. This insitu doping process can be used to form channel region, source regions, and drain regions for transistors in a controlled manner while epitaxial regions are being formed. In FIG. 21, the layers 130 and 134 are respectively a source and drain region of a floating gate transistor formed having a floating gate 126a and a control gate 118. Therefore, regions 130 and 134 are made of a first conductivity type while the channel region 132 is made of a second and opposite conductivity type of regions 130 and 134. In many cases, the floating gate transistor of an EEPROM cell is N-type. Therefore, regions 130 and 134 are insitu doped or ion implanted to form N-type electrodes where region 132 is doped P-type to form a channel region which allows for an N-type inversion region.

Figure 22:
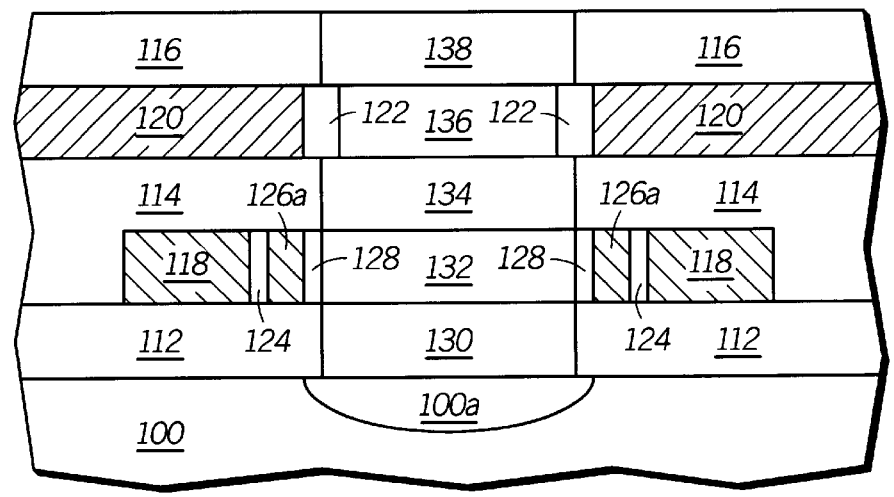

FIG. 22 illustrates that regions 136 and 138 are further grown from the region 134. Regions 134 and 138 are current electrodes (i.e., source and/or drain) to a transistor formed having a gate electrode 120. Region 136 in FIG. 22 is a channel region for the transistor formed by gate 120. The transistor formed by regions 120, 134, 136, and 138 is a select transistor for the EEPROM cell. Select gates are typically formed as N-channel transistors and therefore regions 134 and 138 are N-type where region 136 is a P-type channel region.

Figure 23:
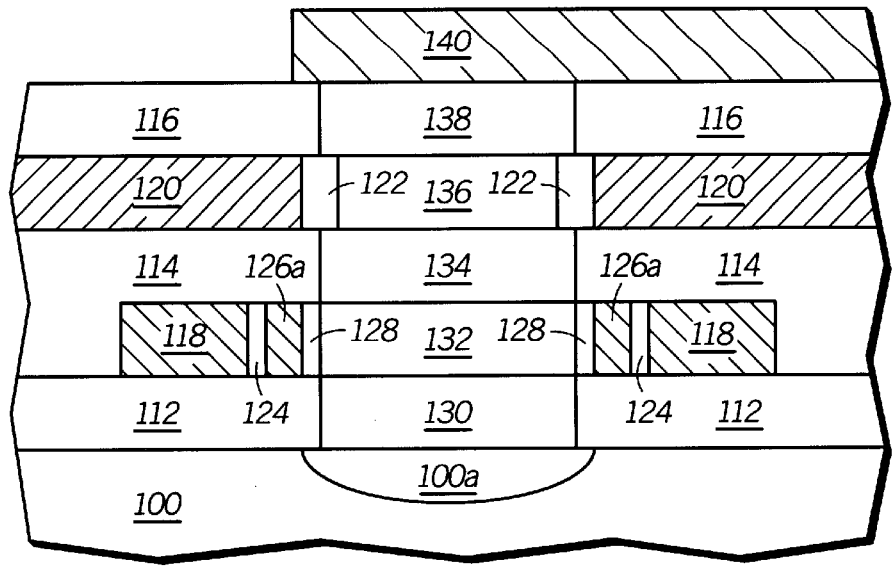

FIG. 23 illustrates that a conductive layer 140 is contacted to the top most electrode 138. Layer 140 can be any conductive layer, but is preferably a metallic line such as tungsten or aluminum.

Figure 24:
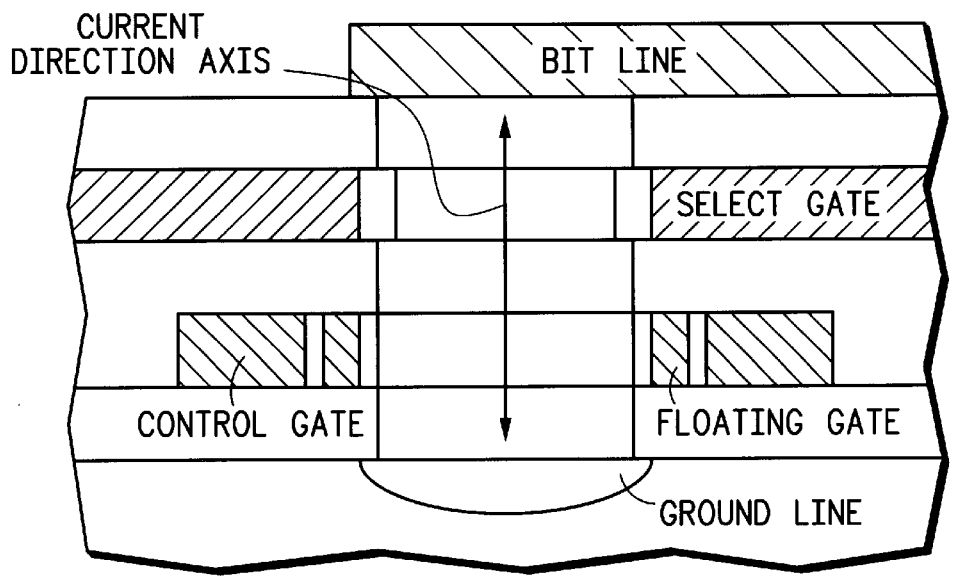

FIG. 24 illustrates the structure of FIG. 23 and labels elements of FIG. 23 according to their EEPROM circuit function. FIG. 24 clearly indicates the floating gate, control gate, select gate, bit line, and ground line for the EEPROM cell.

Figure 25:
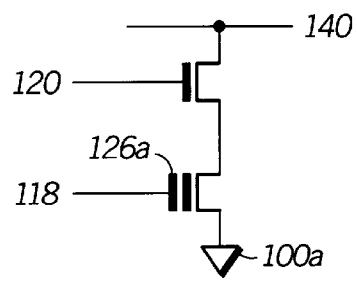
FIG. 25 illustrates, in a circuit diagram, an EEPROM circuit schematic labeled to correlate to the FIG. 23.

FIG. 25 illustrates in a circuit schematic an EEPROM cell labeled in accordance with FIG. 23. FIG. 25 may be used to correlate an EEPROM circuit schematic to the physical cross-sectional device of FIG. 23.

FIGS. 1 through 13 illustrate a process which can be used to form a EEPROM cell which has current flowing within a circumference of gate electrodes. FIGS. 26 through 40 illustrate a trench embodiment for forming and EEPROM cell wherein current flows vertically external to a circumference of gate electrodes. Therefore, FIGS. 26 through 40 illustrate an EEPROM embodiment which is "turned inside-out" from the embodiment of FIGS. 1 through 13.

Figure 26:
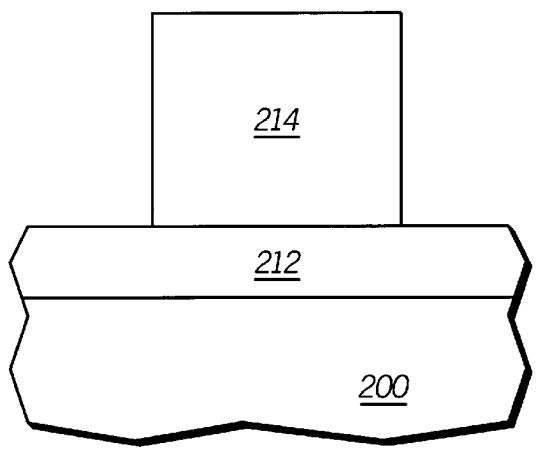
FIGS. 26–39 illustrate, in alternative cross-sectional diagrams and top-down diagrams, a process for forming a trench EEPROM in accordance with the present invention.
Figure 27:
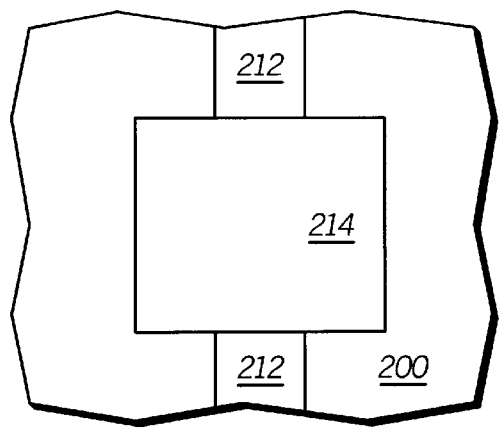
Figure 28:
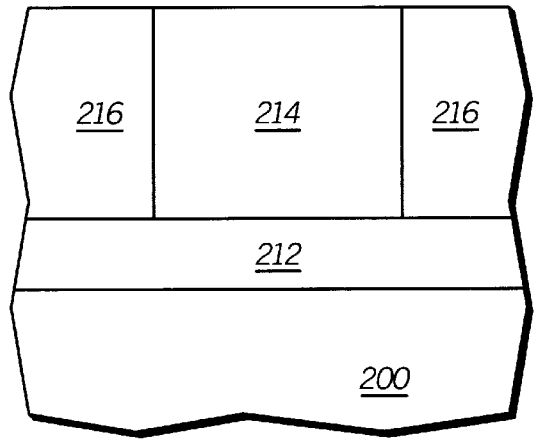
Figure 29:
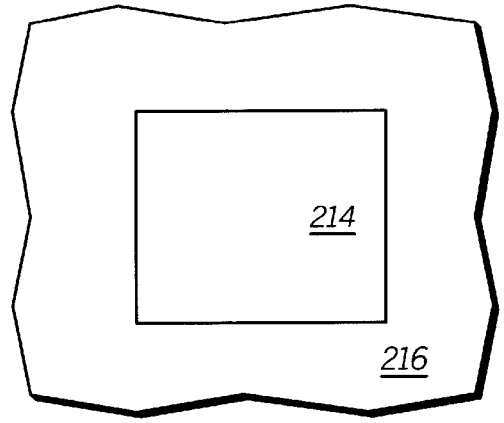
Figure 30:
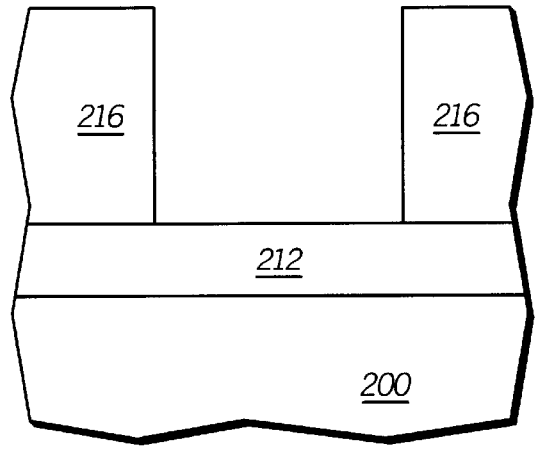
Figure 31:
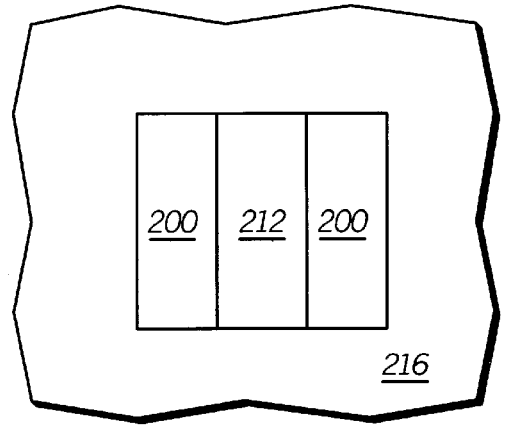

FIG. 26 illustrates a substrate 200. A patterned diffusion region 212 is formed within the substrate 200. A thick oxide block 214 is deposited or grown and lithographically patterned via conventional processing. FIG. 27 illustrates a top down view of FIG. 26 and shows the top down two-dimensional structure of the layers 212 and 214. FIG. 26 is a cross-section of FIG. 27 along line A. FIG. 28 illustrates that epitaxial regions 216 are grown around the oxide block 214. FIG. 29 illustrates a top perspective of FIG. 28 and shows that the epitaxial growth region 216 surrounds the oxide block 214. In FIG. 30, the oxide block 214 is etched or removed via isotropic or anisotropic oxide etching. FIG. 31 illustrates a top perspective view of FIG. 30 once the oxide block 214 is removed.

In another form, oxide block 214 is not needed and selective epitaxial growth is replaced by blanket epitaxial growth. In this alternative form, epitaxial region 216 is grown on top of all portions of diffusion 212 and substrate 200. Subsequently, the blanket epi layer 216 is masked and etched via a timed etch process to result in the structure of FIG. 30. Oxide block 214 is used in FIGS. 26–29 to ensure that diffusion 212 is properly exposed without worrying about microloading, macroloading, etch rate deviations, end point detection and the like that complicates timed-etching.

In another form, The diffusion 212 may be doped with Ge (germanium) so that when the silicon region 216 is etched, etching occurs selective to the Ge in the diffusion 212. Therefore, over and under etching which accompanies timed etches is reduced in significance while Ge is still a semi-conductive element which does not adversely affect the diffusion 212.

One other option is to implant a metallic element into the diffusion 212, such as titanium, tungsten, cobalt, platinum, and/or the like. A heating process will turn this metallic implant into a buried silicide region within the diffusion 212 which will not hinder epitaxial growth processing. The silicide buried region will allow the buried diffusion line 212 to function with lower resistance and thereby improve performance. Other techniques, such as running silicide spacers laterally adjacent an etched sidewall of a diffusion formed within the substrate, can be used to provide a lower resistance strap to the diffusion 212 to benefit performance.

Figure 32:
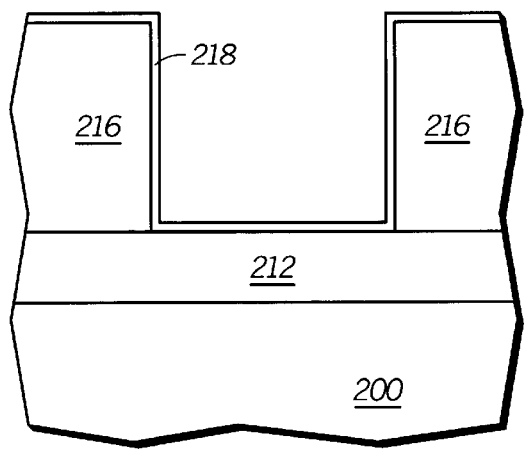
Figure 33:
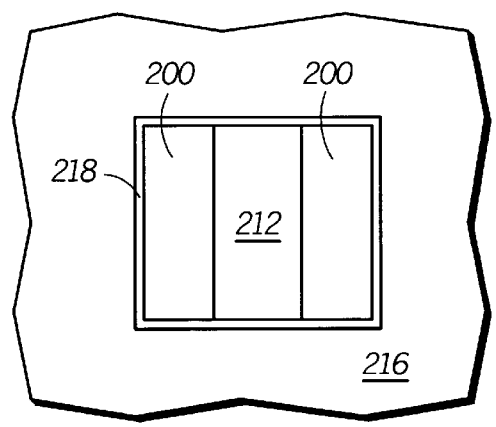

A gate oxide dielectric layer 218 is formed via deposition and/or growth processing in FIG. 32. FIG. 33 illustrates a top perspective view of FIG. 32 after formation of the oxide 218. Layer 218 may be composite dielectric which has misaligned micropores for improved breakdown resistance and reduced leakage current and may also be nitrogen and/or fluorine doped to reduce silicon dangling bonds and thereby reduce threshold-altering surface states.

Figure 34:
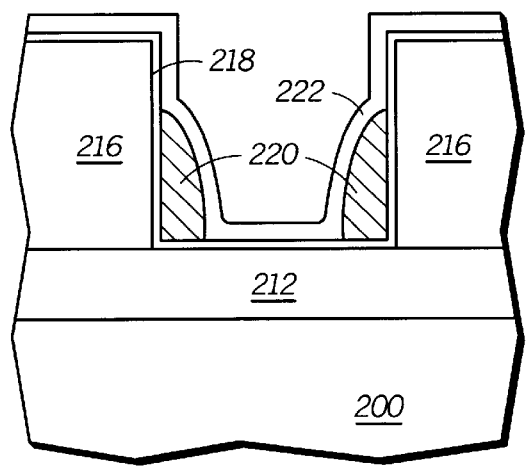
Figure 35:
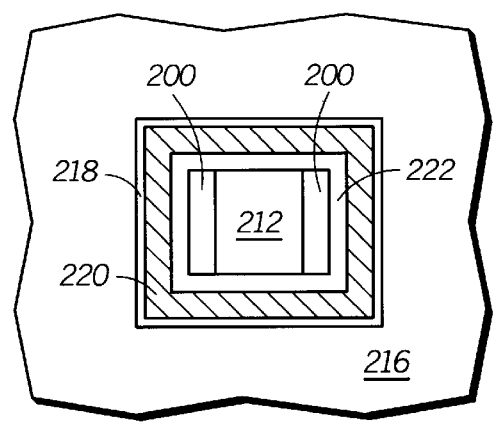

An optimal dielectric to use would be a 20–80 Angstrom thermally grown silicon dioxide layer, followed by an overlying 20–80 Angstrom TEOS deposited layer. This optimal dielectric would then be exposed to both a fluorine (F) and nitrogen (N) ambient to incorporate both F and N into the dielectric preferably at the surface interface between the thermal oxide and the substrate. The N and F provide an interface which improves dielectric characteristics while the composite thermal/TEOS interface mis-aligns micropores and increases gate oxide lifetime, reduces leakage current, and the like. FIG. 34 illustrates that a polysilicon or like conductive layer is deposited and RIE etched to form a cylindrical spacer 220 laterally adjacent and within the opening formed by the removal of oxide block 214. An oxide layer 222 is formed by either deposition or thermal growth to form an oxide which isolates a top portion of the spacers 220. Layer 222 is similar to layer 218 but may also be formed using an oxide-nitride-oxide (ONO) deposition process to form an EEPROM inter-level dielectric layer. FIG. 35 illustrates a top perspective view of FIG. 34.

Figure 36:
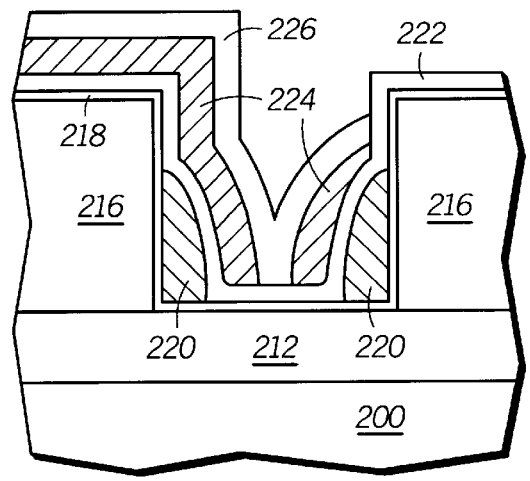
Figure 37:
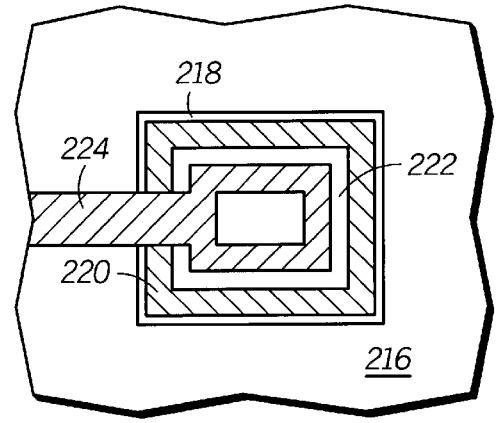

FIG. 36 illustrates that a control gate 224 is formed laterally adjacent the spacer floating gate 220. A deposited or thermal grown oxide layer 226 is formed over the control electrode layer 224. FIG. 37 illustrates a top perspective view of FIG. 36. FIG. 37 clearly indicates that the layer 224 has a cylindrical spacer-like portion within the opening and a tab portion which is used to contact the control gate to an external conductive line. The tab portion may be formed by either soft masking (e.g. using photoresist) or hard masking (e.g. using a nitride or oxide layer) the layer 224 before spacer etching, or by depositing and etching the tap portion after formation of the spacer portion via an additional polysilicon layer.

Figure 38:
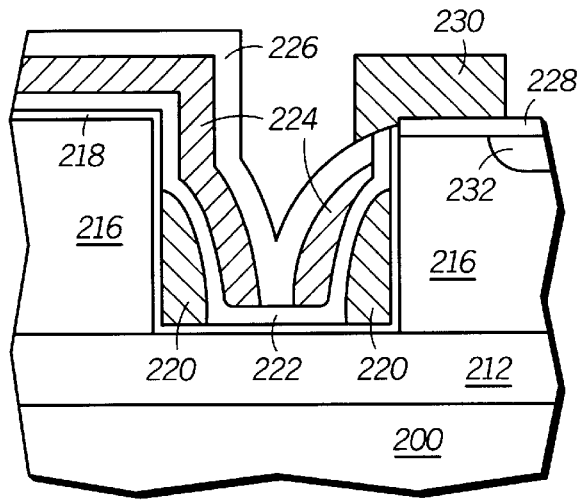
Figure 39:
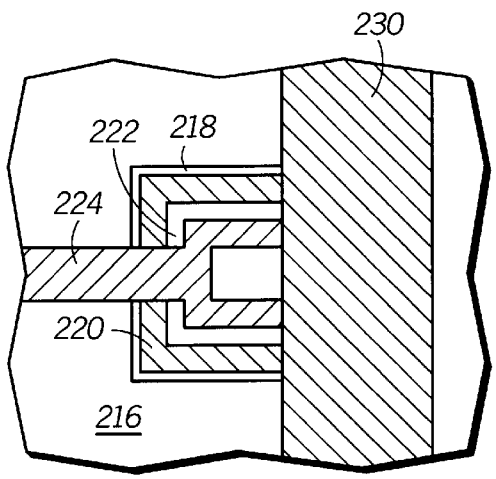

FIG. 38 illustrates that the dielectric layers 218 and 222 are etched over a right most portion of the FIG. 38. This etch is performed to insure that a subsequent gate oxide can be properly grown to a proper thickness. FIG. 38 illustrates that the subsequent oxide 228 is formed after removal of the dielectric layers 218 and 222. A polysilicon or like conductive layer is deposited and patterned to form the select gate electrode 230 in FIG. 38. An electrode region 232 is ion implanted self-aligned to the gate 230 and field/trench isolation (not illustrated in FIG. 38) after the gate 230 is formed. FIG. 39 illustrates a top perspective view of the floating gate storage transistor and the select gate transistor illustrated in FIG. 38 to form an EEPROM cell.

Figure 40:
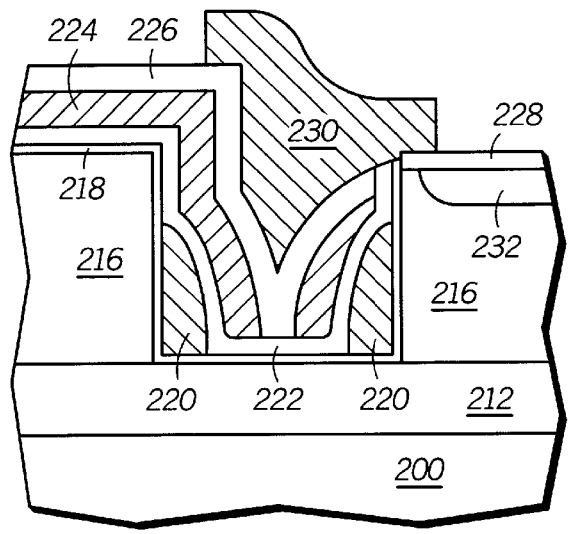
FIG. 40 illustrates, in a cross-sectional diagram, an alternative EEPROM device which is made from the process of FIGS. 26–39 in accordance with the present invention.

FIG. 40 illustrates that the structure in FIG. 39 may be further optimized via further vertical integration by slightly altering the process of FIGS. 26–39. By making the opening deeper (i.e., making the oxide block 214 taller in FIGS. 26–29) one can make the select gate transistor and the select gate electrode 230 more vertically oriented, thereby reducing a surface area of the EEPROM cell.

Figure 41:
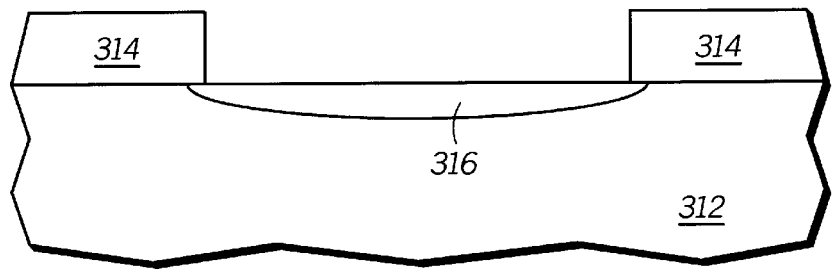
FIGS. 41–45 illustrate, in a cross-sectional diagram, an EEPROM cell which can be integrated with the process illustrated in FIGS. 1–13 in accordance with the present invention.
Figure 42:
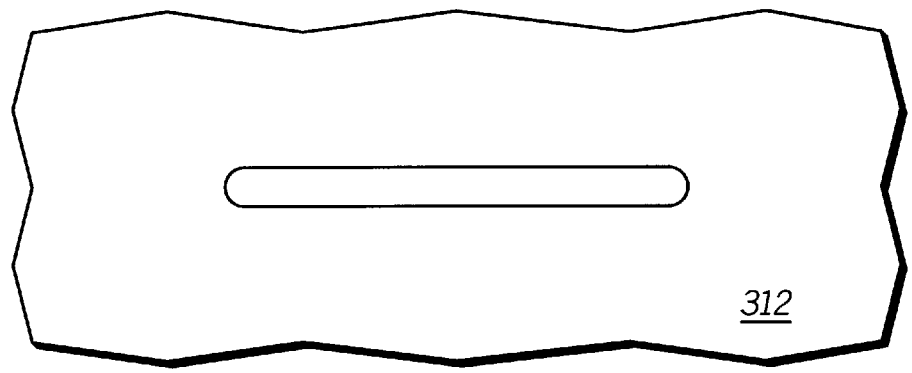
Figure 43:
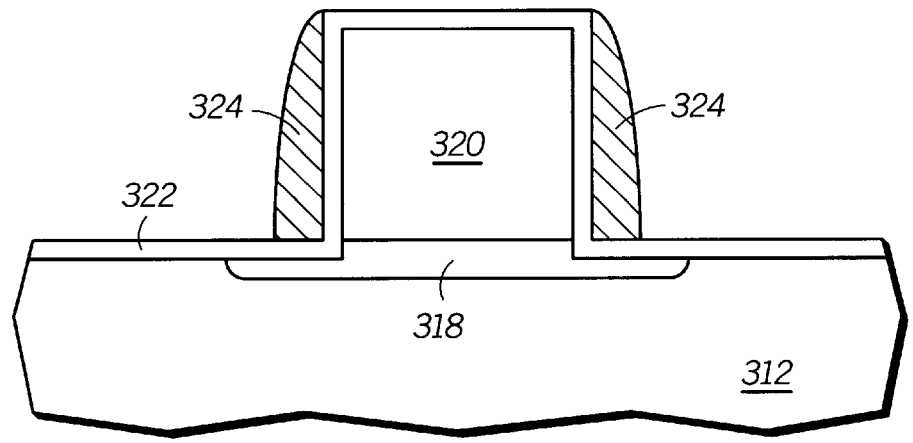
Figure 44:
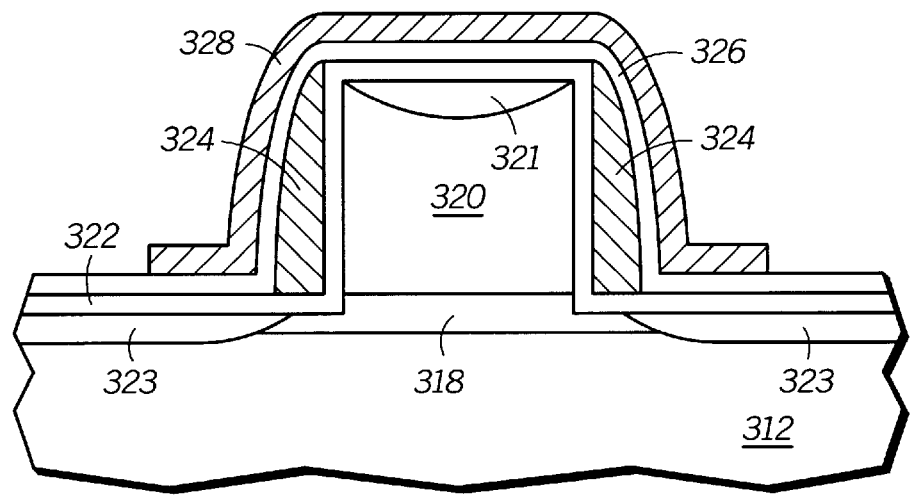

FIGS. 41 through 45 illustrate a process which is used to form an EEPROM cell in a manner compatible with the EEPROM process of FIGS. 1 through 13 or FIGS. 26 through 39. The integration of EEPROM cells and EEPROM cells on the same substrate is becoming increasingly critical to providing quality microcontroller products to integrated circuit (IC) users. FIG. 41 illustrates a substrate 312. A diffusion region 316 is formed within the substrate 312. The dielectric layer 314 is formed in order to provide a mask for the implant which forms layer 316. Epitaxial growth is used to form a blanket epi-region 320. The epitaxial growth of layer 320 makes the layer 318 a buried doped region. It is important to note that the doped region 318 is optional in the process, and therefore it may not be critical that the epitaxial region 320 or the layer 318 be formed. The region 318 is formed to give the device of FIG. 45 silicon on insulator (SOI) properties wherein these properties can be avoided in favor of a conventional substrate-coupled channel region by not creating the layers 318 and 320. The substrate is then patterned and etched to form a remaining pillar region of epitaxial material referred to as region 320 in FIG. 43. The etch process for forming region 320 is timed in order to etch only down to where the region 318 is located. Although the time etch is not overly critical since subsequent doping diffusion of doped regions in the substrate will compensate, a slightly over-etched condition in FIG. 43 is preferred to an under-etched condition. A gate oxide layer 322 is formed over the substrate and region 320. Spacer processing is used on a deposited layer of polysilicon or like layer of material to form a conductive/semiconductive spacer 324. Spacer 324 performs the function of a floating gate EEPROM electrode.

Figure 45:
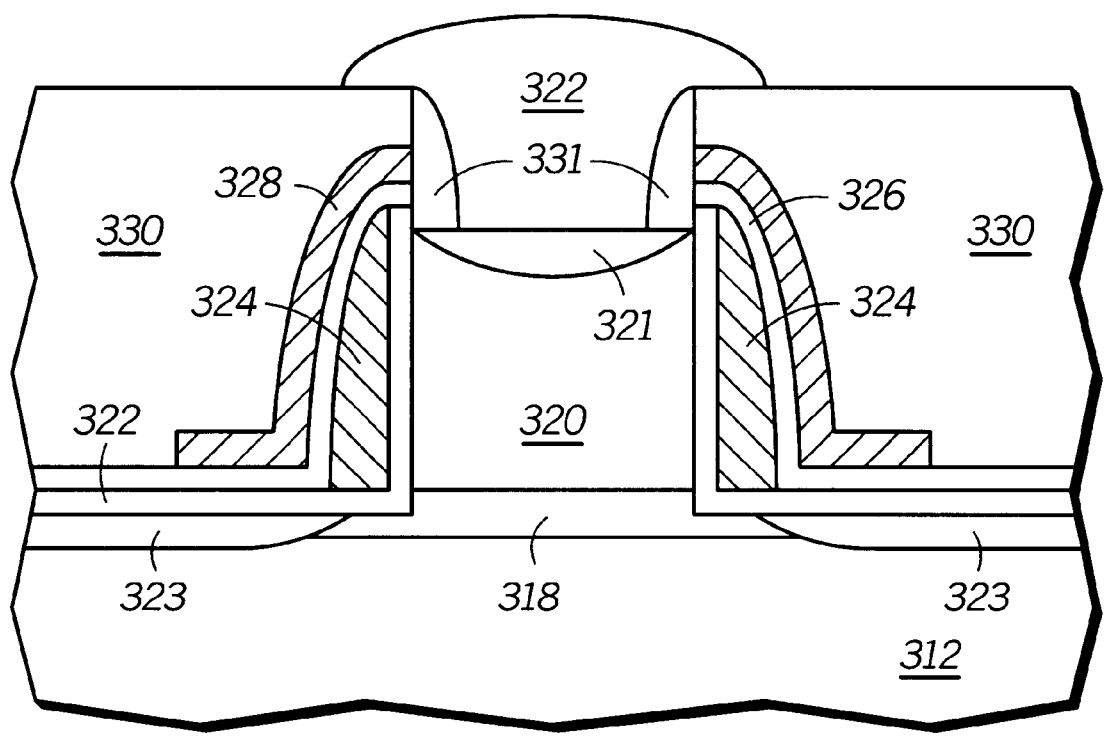

A self-aligned ion implant process is performed to form doped regions 323 and 321 self-aligned to the sidewall spacer 324. After formation of the doped regions 323 and 321, a polysilicon layer 328 is deposited to form a control gate layer. FIG. 45 illustrates that an opening is etched through layers 328 and 326 and 322 to expose a top portion of the diffused region 321. A dielectric sidewall spacer 331 is formed within this opening in FIG. 45 to insure that the control gate 328 and the floating gate 324 are isolated from any subsequent interconnection to the diffusion 321. A metal or semiconductive layer 332 is deposited and patterned to make contact to the layer 321. Therefore, FIG. 45 illustrates an EEPROM cell having a floating gate 324, a control gate 328 and current electrodes 323 and 321. It is important to note that the channel region formed by region 320 is fully isolated from the substrate by region 318. Therefore, the EEPROM illustrated in FIG. 45 will function in a device physical manner similar to an SOI (silicon on insulator) transistor.

In general, the EEPROM or EEPROM cells taught herein can be formed with a smaller footprint (i.e., can be formed in less two-dimensional substrate surface area) than conventional floating gate memory cells. In addition, the use of cylindrical vertical transistors results in a transistor aspect ratio (width/length) which is greater than most conventional planar transistors. This improved aspect ratio (W/L) occurs even though the two-dimensional surface area of the transistor is equal to or less than the conventional planar transistors. This increase in aspect ratio (W/L) is due to the width of a vertical transistor's channel region being the circumference of a circular region of silicon and the length of the transistor's channel region being the height of a spacer or the thickness of a deposited polysilicon layer (e.g., layer 120 thickness from FIG. 23). The aspect ratio of the transistor gated by layer 120 of FIG. 23 is $2\pi r/t$ where r is the radius of the inner circle formed by the cylindrical oxide layer 122 and t is the thickness of the deposited polysilicon layer 120. Typically, r=0.25 microns (a 0.5 micron minimum lithographic limit), and t=0.3 microns resulting in an aspect ratio of 5.236 for the device of FIG. 23. A normal planar MOSFET can form a planar gate above the region 100a (using the same minimum lithographic features of 0.5 micron by forming W=0.5 micron and L=0.5 micron) in the same surface area with an aspect ratio of a maximum of 1. The aspect ration of the transistors in FIG. 23 can be manipulated to an optimal value via deposition thicknesses and by surrounding gate electrode 120 only around a portion of the channel region circumference. Therefore, the vertically oriented cells taught herein not only provide area savings, but can greatly improve device performance by allowing more current per unit area than normal planar transistor cells. In addition, the masking steps required to form vertical devices are significantly reduced when compared to planar transistors, and vertical transistors can be designed to have fully inverted or fully depleted channel regions.

Thus it is apparent that there has been provided, in accordance with the invention, a split-gate vertically oriented EEPROM device, along with several alternate EEPROM and EEPROM embodiments, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, different processing techniques, such as X-ray lithography and electron cyclotron resonance etching, cluster tool deposition and etching, and the like, can be used in the fabrication process. It is therefore intended to include within the invention all such variations and modifications as fall within the scope of the appended claims and equivalents thereof.

We claim:

1. A semiconductor device comprising:
   a substrate having a vertically disposed semiconductor body thereon;
   a doped region in the substrate separating the vertically disposed semiconductor body from the substrate;
   a horizontally disposed gate electrode overlying the substrate adjacent to the vertically disposed semiconductor body; and
   a first vertically disposed gate electrode overlying the horizontally disposed gate electrode and positioned adjacent to the vertically disposed semiconductor body, the vertically disposed gate electrode being electrically floating
   wherein the horizontally disposed gate electrode regulates a flow of electrical charge into the vertically disposed semiconductor body from the substrate.

2. The device of claim 1 further comprising a second vertically disposed gate electrode overlying the horizontally disposed gate electrode and adjacent the first vertically disposed gate electrode.

3. The device of claim 1 further comprising a diffused region in the substrate electrically connecting the doped region with a plurality of doped regions in the substrate.

4. The device of claim 1 further comprising a inversion region in the substrate underlying the horizontally disposed gate electrode and electrically connecting the doped region with a plurality of doped regions in the substrate.

5. A semiconductor device comprising:

a semiconductor substrate having a source region therein;

a vertically disposed channel region overlying the source region;

a select gate electrode overlying the semiconductor substrate adjacent to the vertically disposed channel region;

a dielectric layer overlying the semiconductor substrate and the vertically disposed channel region and separating the select gate electrode therefrom;

a floating gate electrode overlying the select gate electrode and surrounding a portion of the vertically disposed channel region; and a control gate electrode overlying the select gate electrode and surrounding the floating gate electrode, wherein the control gate electrode controls an electrical charge state of the floating gate electrode, and wherein the select gate electrode regulates flow of electrical charge into the vertically disposed channel region from the semiconductor substrate.

6. The device of claim 5 further comprising a diffused region in the semiconductor substrate electrically connecting the source region with a plurality of source regions in the semiconductor substrate.

7. The device of claim 5 further comprising an inversion region in the semiconductor substrate underlying the select gate electrode and electrically connecting the source region with a plurality of doped regions in the semiconductor substrate.

8. The device of claim 5 further comprising a drain region, wherein the vertically disposed channel region separates the drain region from the source region.

9. A semiconductor device comprising:

a plurality of EEPROM memory cells each having a horizontally disposed select gate electrode overlying a substrate, and first vertically disposed channel region formed through a first opening in the select gate electrode and second vertically disposed channel region formed through an opening in the select gate electrode, wherein each of the first and second channel regions is bounded by a floating gate electrode and a control gate electrode which bounds each floating gate electrode, and wherein the select gate electrode physically isolates the floating gate electrode and the control gate electrode from the substrate.

10. The semiconductor device of claim 9 wherein an adjacent EEPROM cell is formed laterally adjacent the plurality of EEPROM memory cells wherein a current electrode of the adjacent EEPROM cell is coupled to a current electrode of only one EEPROM memory cell in the plurality of EEPROM memory cells.

11. A semiconductor device comprising:

a substrate;

a first transistor overlying the substrate, the first transistor having a first current electrode overlying a second current electrode wherein the first and second current electrodes are separated bye a channel region, a floating gate electrode laterally adjacent the channel region, and a control gate electrode laterally adjacent the floating gate electrode; and a second transistor overlying the first transistor and being serially coupled to the first transistor, the second transistor having a first current electrode overlying a second current electrode, a channel region separating the first and second current electrodes, and a select gate electrode laterally adjacent the channel region, wherein the first transistor is a floating gate storage transistor for storing a logic bit value and the second transistor is a select gate for selecting the first transistor.

12. The semiconductor device of claim 11 wherein a diffusion region is formed within the substrate and coupled to the second current electrode of the first transistor.

13. The semiconductor device of claim 11 wherein the floating gate electrode is a donut-shaped silicon member which surrounds the channel region of the first transistor wherein the channel region is a cylindrical region of silicon.

14. The semiconductor device of claim 11 wherein one of either the first and second transistor has a gate dielectric region which comprises a first dielectric region formed by a first means and a second dielectric region formed adjacent the first dielectric region where the second dielectric region is formed by a second means that is different from the first means.

15. The semiconductor device of claim 14 wherein the gate dielectric region is exposed to one of either nitrogen or fluorine to form a nitrogen or fluorine rich region within the gate dielectric region.

16. The semiconductor device of claim 14 wherein the gate dielectric region is exposed to both nitrogen and fluorine to form a nitrogen and fluorine rich region within the gate dielectric region.

17. The semiconductor device of claim 11 wherein a metallic conductor line is coupled to the first current electrode of the second transistor.

18. A semiconductor device comprising:

a substrate;

a first transistor overlying the substrate, the first transistor having a first current electrode underlying a channel region, and a select gate electrode laterally adjacent the channel region; and a second transistor overlying the first transistor and being serially coupled to the first transistor, the second transistor having a second current electrode overlying the channel region wherein the first and second current electrodes are separated by the channel region, a floating gate electrode adjacent the channel region, wherein the floating gate electrode is further characterized as a spacer which surrounds the channel region of the second transistor, and wherein the channel region of the second transistor is a cylindrical region and a control gate electrode laterally adjacent the floating gate electrode, wherein the second transistor is a floating gate storage transistor for storing a logic bit value and the first transistor is a select gate for selecting the second transistor.

19. A semiconductor device comprising:

a first transistor having a first channel region and a select gate having a first vertically-oriented sidewall which is laterally adjacent the first channel region and a first circumference, current flowing in the first channel region substantially parallel to the first vertically-oriented sidewall and entirely within the first circumference, the first transistor being oriented such that an axis passes centrally through the first channel region; and a second transistor having a second channel region where the second transistor is electrically coupled in series to the first transistor and being oriented such that the axis passes centrally through the second channel region, the second transistor having a floating gate which has a second vertically-oriented sidewall laterally adjacent the second channel region and a control gate laterally adjacent the floating gate, the floating gate having a second circumference where current flows in the second channel region substantially parallel to the second vertically-oriented sidewall and within the second circumference, the first and second transistors overlying a top surface of a substrate.

20. The semiconductor device of claim 19 wherein the first transistor overlies the second transistor and the second transistor is coupled to a substrate.

21. The semiconductor device of claim 20 wherein the second transistor is coupled to a diffusion region within the substrate.

22. The semiconductor device of claim 19 wherein the second transistor overlies the first transistor and the first transistor is coupled to a substrate.

23. The semiconductor device of claim 22 wherein the first transistor is coupled to a diffusion region within the substrate.

24. A semiconductor device comprising:
a first transistor having a first current electrodes overlying a second current electrode where a first channel region physically separates the first current electrode from the second current electrode, the first transistor being oriented such that an axis passes centrally through the first current electrode, the second current electrode and the first channel region, the first transistor having a select gate laterally adjacent the first channel region; and
a second transistor having a third current electrode overlying a fourth current electrode where a second channel region physically separates the third current electrode from the fourth current electrode, the second transistor being electrically coupled in series to the first transistor and being oriented such that the axis passes centrally through the third current electrode, the fourth current electrode and the second channel region, the second transistor having a floating gate laterally adjacent the second channel region and a control gate laterally adjacent the floating gate, wherein the first, second, third and fourth current electrodes are epitaxially grown material from a substrate and have a atomic structure similar to the substrate.

25. The semiconductor device of claim 24 wherein the second and third current electrodes are coupled together to form a single common current electrode.

26. A method for forming a semiconductor device comprising the steps of:
providing a diffusion region which is made of a material capable of selective growth;
growing a first current electrode vertically from the diffusion region;
growing a first channel region portion vertically from the first current electrode;
growing a second channel region portion vertically from the first channel region portion;
forming a third current electrode coupled to the second channel region;
forming a floating gate electrode laterally adjacent a first selected region selected from a group consisting of: the first channel region portion and the second channel region portion;
forming a select gate electrode laterally adjacent a second selected region selected from a group consisting of: the first channel region portion and the second channel region portion, wherein the second selected region is different from the first selected region; and
forming a control gate electrode laterally adjacent the floating gate electrode.

27. The method of claim 26 further comprising the step of:
growing a second current electrode vertically from the first channel region portion wherein the second current electrode separates the first channel region portion from the second channel region portion.

28. A method for forming a semiconductor device comprising the steps of:
providing a substrate;
forming a vertically-oriented conductive region overlying and contacted to the substrate, the vertically-oriented conductive region having a first current electrode at a bottom portion of the vertically-oriented conductive region, a first channel region portion overlying the first current electrode, a second channel region portion overlying the first channel region portion, and a second current electrode overlying the second channel region portion;
forming a select gate electrode laterally adjacent the second channel region portion;
forming a floating gate electrode laterally adjacent the first channel region portion; and
forming a control electrode adjacent the floating gate. electrode.

29. The method of claim 28 wherein the step of forming a vertically-oriented conductive region comprises:
forming a third current electrode between the first and second channel region portions to physically isolate the first channel region portion from the second channel region portion.

30. The method of claim 28 wherein the step of forming a floating gate electrode comprises:
depositing a conformal layer of silicon-comprising material and etching the silicon-comprising material to form a sidewall structure which forms the floating gate electrode.

31. The method of claim 28 wherein the step of forming a control gate electrode comprises:
forming a sidewall of the control gate electrode where the sidewall is perpendicular to a surface of the substrate; and
recessing the sidewall of the control gate electrode via a laterally-oriented etch process to form a recessed region.

32. The method of claim 31 wherein the step of recessing the sidewall further comprises:
forming the floating gate electrode within the recessed region.

33. The method of claim 28 the step of forming a vertically-oriented conductive region further comprises:
forming the vertically-oriented conductive region by selectively growing the vertically-oriented conductive region.

34. The method of claim 28 wherein the step of forming a vertically-oriented conductive region comprises:
forming the vertically-oriented conductive region by doping the vertically-oriented conductive region to form the first and second current electrodes, the doping being performed by one of either: ion implantation, diffusion, or insitu doping.

35. The method of claim 28 wherein the step of forming a vertically-oriented conductive region further comprises:

forming the vertically-oriented conductive region by doping the vertically-oriented conductive region to form the first and second channel region portions, the doping being performed by one of either: ion implantation, diffusion, or insitu doping.

36. A method for forming a semiconductor device comprising the steps of:

providing a substrate having a top surface;

forming a vertically-oriented channel region wherein current flows through the vertically-oriented channel region perpendicular to the top surface of the substrate;

forming a thermally grown oxide layer laterally adjacent the vertically-oriented channel region, the thermally grown oxide layer having micropores therethrough;

forming a deposited dielectric layer laterally adjacent the thermally grown oxide layer wherein the deposited dielectric layer has micropores misaligned to the thermally grown oxide layer;

exposing the deposited dielectric layer to a dopant species to dope one of either the thermally grown oxide layer or the deposited dielectric layer with a species selected from the group consisting of: nitrogen and fluorine; and forming a gate electrode laterally adjacent the deposited dielectric layer.

37. A method for forming a semiconductor device comprising the steps of:

forming a plurality of source electrode diffusion regions with dopant atoms of a first conductivity type within a substrate, the plurality of source electrode diffusion regions being separated from each other by disconnection regions wherein the disconnection regions are doped with dopant atoms of an second conductivity type wherein the second conductivity type is opposite the first conductivity type;

forming a gate electrode overlying the disconnection regions, the gate electrode being one gate electrode in a memory cell structure;

selectively enabling the gate electrode to selectively couple together the plurality of source electrode diffusion regions in the plurality of source electrode diffusion regions via inversion regions formed within the disconnection regions, wherein the inversion regions are regions of the first conductivity type formed via enablement of the gate electrode; and transmitting an electrical voltage signal through all of the inversion regions and the plurality of source electrode diffusion regions.

38. A method for forming a semiconductor device comprising the steps of:

providing a silicon diffusion region which is made of a material capable of selective growth;

growing a first current electrode vertically from the silicon diffusion region, the first current electrode being of a first conductivity type;

growing a first channel region portion vertically from the first current electrode, the first channel region being of a second conductivity type which is opposite the first conductivity type;

growing a second channel region portion vertically from the first channel region portion;

forming a third current electrode coupled to the second channel region portion, the third current electrode being of the first conductivity type;

forming a floating gate electrode laterally adjacent a first selected region selected from a group consisting of: the first channel region portion and the second channel region portion;

forming a select gate electrode laterally adjacent a second selected region selected from a group consisting of: the first channel region portion and the second channel region portion, wherein the second selected region is different from the first selected region; and forming a control gate electrode laterally adjacent the floating gate electrode.

* * * * *